United States Patent
Hishida et al.

(10) Patent No.: US 8,203,882 B2
(45) Date of Patent: Jun. 19, 2012

(54) NON-VOLATILE SEMICONDUCTOR STORAGE DEVICE

(75) Inventors: Tomoo Hishida, Yokohama (JP); Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 138 days.

(21) Appl. No.: 12/718,353

(22) Filed: Mar. 5, 2010

(65) Prior Publication Data
US 2010/0238732 A1 Sep. 23, 2010

(30) Foreign Application Priority Data
Mar. 23, 2009 (JP) .................. 2009-070533

(51) Int. Cl.
G11C 16/04 (2006.01)
(52) U.S. Cl. .................. 365/185.17; 365/185.29
(58) Field of Classification Search ............ 365/185.17, 365/185.29, 185.33
See application file for complete search history.

(56) References Cited

U.S. PATENT DOCUMENTS

| 7,623,384 B2 | 11/2009 | Iwata | |
| 2005/0270846 A1* | 12/2005 | Watanabe et al. | 365/185.17 |
| 2007/0252201 A1 | 11/2007 | Kito et al. | |
| 2008/0112226 A1* | 5/2008 | Mokhlesi | 365/185.17 |
| 2008/0315296 A1* | 12/2008 | Tanaka et al. | 257/326 |
| 2011/0079835 A1* | 4/2011 | Noguchi et al. | 257/298 |

FOREIGN PATENT DOCUMENTS

| JP | 2845843 | 10/1998 |
| JP | 2007-266143 | 10/2007 |

OTHER PUBLICATIONS

Yasuo Itoh, et al. "Session 10: Nonvolatile Memories; Tham 10.4: An Experimental 4Mb CMOS EEPROM with a NAND Structured Cell," IEEE International Solid-State Circuits Conference, Feb. 16, 1989, 3 pages.
Satyen Mukherjee, et al. "A Single Transistor EEPROM Cell and Its Implementation in a 512K CMOS EEPROM," IEDM Tech. Digest, 1985, pp. 616-619.
H. Tanaka, et al. "Bit Cost Scalable Technology with Punch and Plug Process for Ultra High Density Flash Memory." Symposium on VLSI Technology Digest of Technical Papers, 2007, pp. 14-15.
Yoshiaki Fukuzumi, et al. "Optimal Integration and Characteristics of Vertical Array Devices for Ultra-High Density, Bit-Cost Scalable Flash Memory." IEEE, 2007, pp. 449-452.
U.S. Appl. No. 12/886,874, filed Sep. 21, 2010, Iwata.
U.S. Appl. No. 13/041,579, filed Mar. 7, 2011, Iwai, et al.
Office Action issued Jul. 5, 2011, in Japanese Patent Application No. 2009-070533 (with English-language translation).

* cited by examiner

*Primary Examiner* — Vu Le
(74) *Attorney, Agent, or Firm* — Oblon, Spivak, McClelland, Maier & Neustadt, L.L.P.

(57) ABSTRACT

When a data erase operation is performed in one memory cell block, a first voltage is applied to one source line selected from m source lines in the one memory cell block. A second voltage equal to a voltage of the source lines before the data erase operation begins is applied to the other source lines. Then, after a certain time delay from application of the first voltage, a third voltage smaller than the first voltage is applied to a third conductive layer of a source-side selection transistor connected to a selected source line. Then, a hole current is produced near a third gate insulation layer due to a potential difference between the first and third voltage. A fourth voltage is applied to one of first conductive layers connected to one of the memory transistor to be erased. The other first conductive layers are brought into a floating state.

20 Claims, 22 Drawing Sheets

NON-VOLATILE SEMICONDUCTOR STORAGE DEVICE

CROSS REFERENCE TO RELATED APPLICATIONS

This application is based on and claims the benefit of priority from prior Japanese Patent Application No. 2009-70533, filed on Mar. 23, 2009, the entire contents of which are incorporated herein by reference.

BACKGROUND OF THE INVENTION

1. Field of the Invention

The present invention relates to an electrically rewritable non-volatile semiconductor storage device.

2. Description of the Related Art

As refinement technologies are pushed to the limit for improving the bit density of non-volatile semiconductor storage devices such as NAND type flash memory, there is increasing demand for lamination of memory cells. As one example, there have been proposed lamination-type non-volatile semiconductor storage devices where memory cells are configured with vertical transistors (see, for example, Japanese Patent Laid-Open No. 2007-266143). The lamination-type non-volatile semiconductor storage device comprises a plurality of memory blocks that are configured in erase units. Each memory block has memory strings, each of which has a plurality of memory cells connected in series. Each memory string has a columnar semiconductor layer, a MONOS layer formed to surround the columnar semiconductor layer, and a conductive layer formed to surround the MONOS layer.

Conventionally, in the above-mentioned non-volatile semiconductor storage device, the erase operation is performed per memory cell block. That is, in the erase operation, all data is first erased from each memory block, and any data that does not need to be erased is written back to the memory block. As such, this erase operation requires write-back of data, which can be time-consuming.

SUMMARY OF THE INVENTION

One aspect of the present invention provides a non-volatile semiconductor storage device comprising: a memory string including a plurality of memory transistors connected in series; a drain-side selection transistor formed at one end of the memory string and operative to be conductive when selecting the memory string; a source-side selection transistor formed at the other end of the memory string and operative to be conductive when selecting the memory string; a bit line connected to the other end of the drain-side selection transistor, the bit line operative to be provided with a voltage corresponding to data to be written to a respective one of the memory transistors and to read a signal read from a respective one of the memory transistors; a source line connected to the other end of the source-side selection transistor; and a control circuit configured to control the memory transistors, the drain-side selection transistor, and the source-side selection transistor to perform read, write, and erase operations on the memory transistors, the memory string comprising: a first semiconductor layer having a columnar portion extending in a vertical direction to a substrate and functioning as a body of a respective one of the plurality of memory transistors; an electric charge accumulation layer formed to surround the first semiconductor layer; and a first conductive layer formed to surround the electric charge accumulation layer and extend in parallel to the substrate, the first conductive layer being laminated to form a plurality of layers and functioning as gates of the plurality of memory transistors, the drain-side selection transistor comprising: a second semiconductor layer in contact with one end of the first semiconductor layer and extending in the vertical direction to the substrate, the second semiconductor layer functioning as a body of the drain-side selection transistor; a second gate insulation layer formed to surround the second semiconductor layer; and a second conductive layer surrounding the second gate insulation layer and extending in parallel to the substrate, the second conductive layer functioning as a gate of the drain-side selection transistor, the source-side selection transistor comprising: a third semiconductor layer in contact with the other end of the first semiconductor layer and extending in the vertical direction to the substrate, the third semiconductor layer functioning as a body of the source-side selection transistor; a third gate insulation layer formed to surround the third semiconductor layer; and a third conductive layer surrounding the third gate insulation layer and extending in parallel to the substrate, the third conductive layer functioning as a gate of the source-side selection transistor, m rows and n columns of the first semiconductor layers arranged on the substrate being included in one memory cell block (where m and n are integers not less than 2), each of the first conductive layers being commonly connected to the (m×n) first semiconductor layers arranged in the one memory cell block, each of the second conductive layers being commonly connected to the n second semiconductor layers arranged along a first direction in the one memory cell block, each of the third conductive layers being commonly connected to the n third semiconductor layers arranged along the first direction in the one memory cell block, each of the bit lines being commonly connected to the m second semiconductor layers arranged along a second direction orthogonal to the first direction in the one memory cell block, each of the source lines being commonly connected to the n third semiconductor layers arranged along the first direction in the one memory cell block, when performing a data erase operation in the one memory cell block, the control circuit being configured to: apply a first voltage to one source line selected from the m source lines in the one memory cell block, while applying a second voltage to the other source lines, the second voltage being equal to a voltage of the source lines before the data erase operation begins; then, after a certain time delay from application of the first voltage, apply a third voltage smaller than the first voltage to the third conductive layer of the source-side selection transistor connected to the selected source line, thereby producing a hole current near the third gate insulation layer due to a potential difference between the first voltage and the third voltage; and apply a fourth voltage to one of the first conductive layers that is connected to the memory transistor to be erased, while bringing the other first conductive layers into a floating state, thereby causing a change in electric charge of the electric charge accumulation layers due to a potential difference between potentials of the first semiconductor layers and the first conductive layers.

Another aspect of the present invention provides a non-volatile semiconductor storage device comprising: a memory string including a plurality of memory transistors connected in series; a drain-side selection transistor formed at one end of the memory string and operative to be conductive when selecting the memory string; a source-side selection transistor formed at the other end of the memory string and operative to be conductive when selecting the memory string; a bit line connected to the other end of the drain-side selection transistor, the bit line operative to be provided with a voltage corresponding to data to be written to a respective one of the memory transistors and to read a signal read from a respective one of the memory transistors; a source line connected to the other end of the source-side selection transistor; and a control circuit configured to control the memory transistors, the drain-side selection transistor, and the source-side selection transistor to perform read, write, and erase operations on the memory transistors, the memory string comprising: a first semiconductor layer having a columnar portion extending in a vertical direction to a substrate and functioning as a body of a respective one of the plurality of memory transistors; an electric charge accumulation layer formed to surround the first semiconductor layer; and a first conductive layer formed to surround the electric charge accumulation layer and extend in parallel to the substrate, the first conductive layer being laminated to form a plurality of layers and functioning as gates of the plurality of memory transistors, the drain-side selection transistor comprising: a second semiconductor layer in contact with one end of the first semiconductor layer and extending in the vertical direction to the substrate, the second semiconductor layer functioning as a body of the drain-side selection transistor; a second gate insulation layer formed to surround the second semiconductor layer; and a second conductive layer surrounding the second gate insulation layer and extending in parallel to the substrate, the second conductive layer functioning as a gate of the drain-side selection transistor, the source-side selection transistor comprising: a third semiconductor layer in contact with the other end of the first semiconductor layer and extending in the vertical direction to the substrate, the third semiconductor layer functioning as a body of the source-side selection transistor; a third gate insulation layer formed to surround the third semiconductor layer; and a third conductive layer surrounding the third gate insulation layer and extending in parallel to the substrate, the third conductive layer functioning as a gate of the source-side selection transistor, m rows and n columns of the (m×n) first semiconductor layers arranged on the substrate being included in one memory cell group (where m and n are integers not less than 2), each of the first conductive layers being commonly connected to the n first semiconductor layers aligned along a first direction in the one memory cell group, each of the second conductive layers being commonly connected to the n second semiconductor layers arranged along the first direction in the one memory cell group, each of the third conductive layers being commonly connected to the n third semiconductor layers arranged along the first direction in the one memory cell group, each of the bit lines being commonly connected to the m second semiconductor layers arranged along a second direction orthogonal to the first direction in the one memory cell group, each of the source lines being commonly connected to the (m×n) third semiconductor layers in the one memory cell group, when performing a data erase operation in the one memory cell group, the control circuit being configured to: apply a first voltage to one of the source lines that is disposed in the memory cell group in which the memory transistor to be erased is present; then, after a certain time delay from application of the first voltage, apply a second voltage smaller than the first voltage to one of the m third conductive layers in the one memory cell group that is connected to the source-side selection transistor corresponding to the memory transistor to be erased, thereby producing a hole current near the third gate insulation layer due to a potential difference between the first voltage and the second voltage, while applying a third voltage to the other third conductive layers, the third voltage being equal to a voltage of the third conductive layers before the data erase operation begins; and apply a fourth voltage to one of the first conductive layers that is connected to the memory transistor to be erased, while bringing the other first conductive layers into a floating state, thereby causing a change in electric charge of the electric charge accumulation layers due to a potential difference between potentials of the first semiconductor layers and the first conductive layers.

DETAILED DESCRIPTION OF THE EMBODIMENTS

Embodiments of a non-volatile semiconductor storage device according to the present invention will now be described below with reference to the accompanying drawings.

First Embodiment

Figure 1:
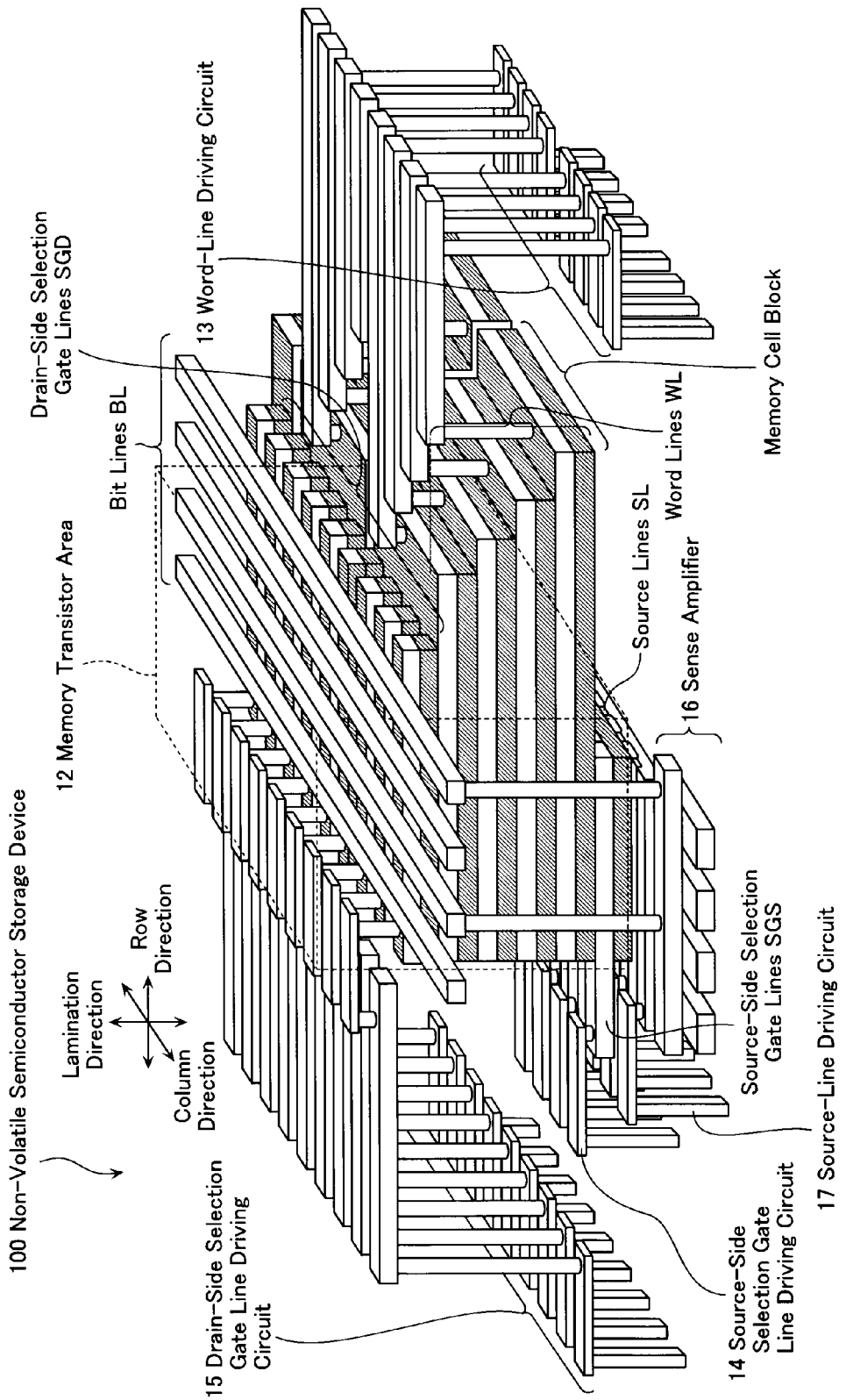
FIG. 1 is a schematic view of a non-volatile semiconductor storage device 100 according to a first embodiment of the present invention.
Figure 2:
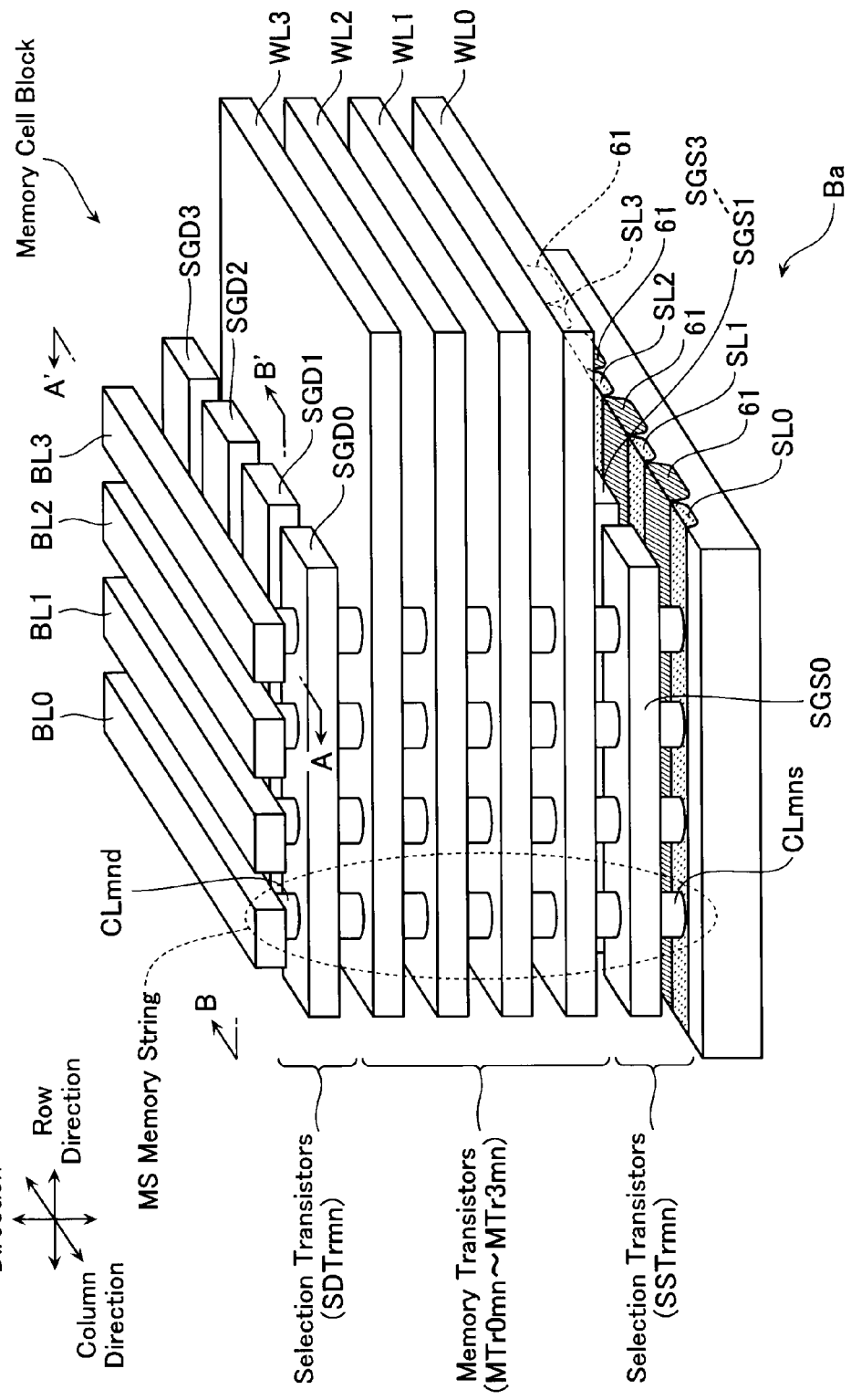
FIG. 2 is a perspective view illustrating a configuration of the memory transistors in one memory cell block.

Configuration of Non-Volatile Semiconductor Storage Device 100 in First Embodiment FIG. 1 is a schematic diagram of a non-volatile semiconductor storage device 100 according to a first embodiment of the present invention. FIG. 2 is a perspective view illustrating a configuration of the memory transistors in one memory cell block; and FIG. 3 is an equivalent circuit diagram illustrating a configuration of one memory string included in a memory cell array.

As illustrated in FIG. 1, the non-volatile semiconductor storage device 100 according to the first embodiment mainly comprises: a memory transistor area 12; a word-line driving circuit 13; a source-side selection gate line (SGS) driving circuit 14; a drain-side selection gate line (SGD) driving circuit 15; a sense amplifier 16; and a source-line driving circuit 17.

As described below, the memory transistor area 12 has a three-dimensional structure in which a plurality of memory transistors MTr for storing data are not only arranged in a matrix form in the planar direction (row and column directions), but also laminated and arranged in a matrix form in the lamination direction.

Figure 3:
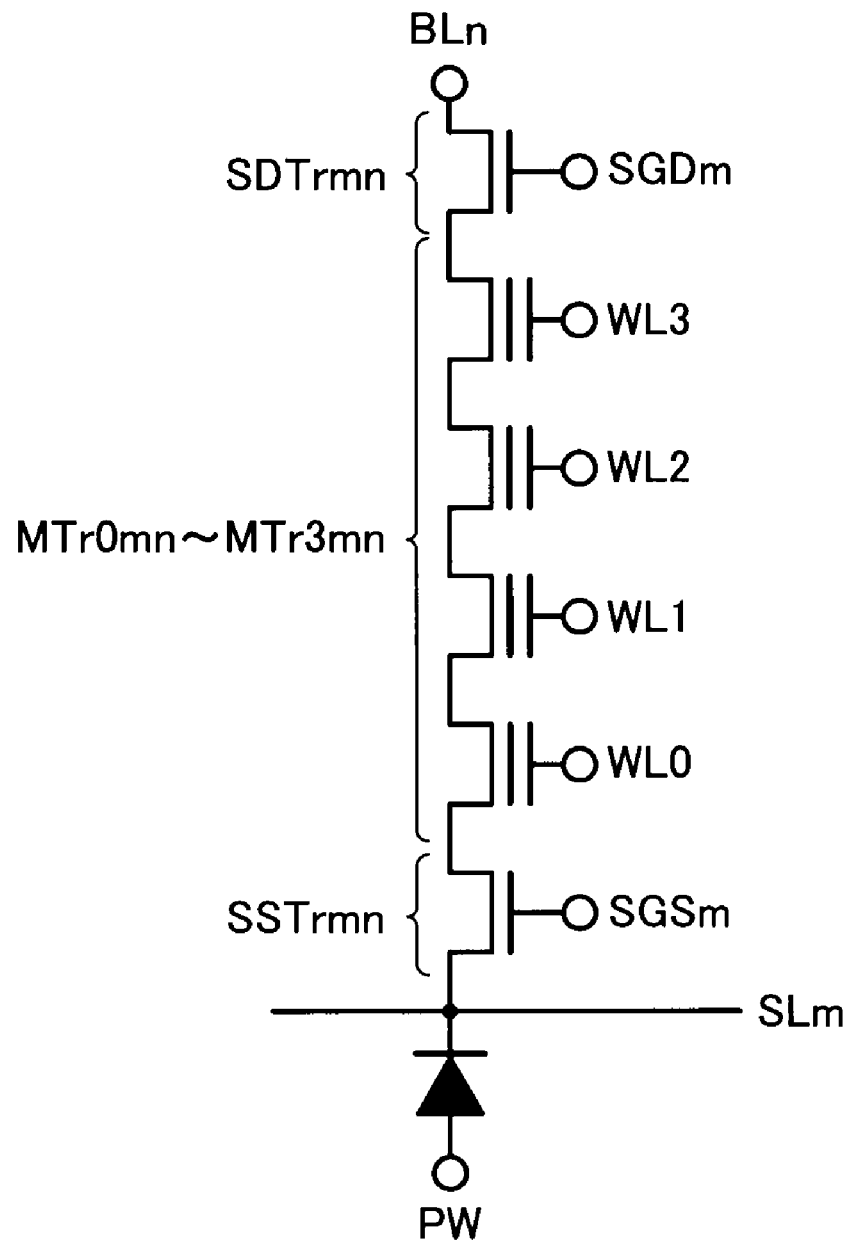
FIG. 3 is an equivalent circuit diagram illustrating a configuration of one memory string included in a memory cell array.

As illustrated in FIG. 3, memory transistors MTr0*mn* to MTr3*mn* are laminated in the lamination direction and connected in series with one another to form a NAND string (memory string), which will be discussed later. Additionally, a drain-side selection transistor SDTrmn and a source-side selection transistor SSTrmn are connected to each end of this NAND string. The drain-side selection transistor SDTrmn and the source-side selection transistor SSTrmn have the other ends connected to a bit line BLn and a source line SLm, respectively. In addition, the drain-side selection transistor SDTrmn and the source-side selection transistor SSTrmn have their gates connected to a drain-side selection gate line SGDm and a source-side selection gate line SGSm, respectively.

As described below, each word line WL is formed in a plate-like manner in one memory cell block (so that a plurality of memory strings are commonly connected each of the word lines), and a plurality of such word lines are laminated therein. Each bit line BL is formed with the column direction of FIG. 1 taken as its longitudinal direction, and a plurality of (in this case four, in one memory cell block) such bit lines BL are formed in the row direction. In addition, the drain-side selection gate lines SGD and the source-side selection gate lines SGS are formed with a direction orthogonal to the bit lines BL, i.e., the row direction taken as their longitudinal direction. Four drain-side selection gate lines SGD and four source-side selection gate lines SGS are provided for each memory cell block. Source lines SL are also formed with the direction orthogonal to the bit lines BL, i.e., the row direction taken as their longitudinal direction. Four source lines SL are provided for each memory cell block.

The word-line driving circuit 13 controls voltage applied to the word lines WL. The source-side selection gate line (SGS) driving circuit 14 controls voltage applied to the source-side selection gate lines SGS. The drain-side selection gate line (SGD) driving circuit 15 controls voltage applied to the drain-side selection gate lines (SGD). The sense amplifier 16 detects and amplifies a signal appearing at a bit line BL to read data retained in a memory transistor MTr, and supplies a voltage to the bit line BL that corresponds to the data to be written. The source-line driving circuit 17 controls voltage applied to the source lines SL.

FIG. 2 schematically illustrates a configuration of one memory cell block in the memory transistor area 12 in the non-volatile semiconductor storage device 100 according to the first embodiment of the present invention. According to the first embodiment of the present invention, one memory cell block in the memory transistor area 12 has M×N memory strings MS (where M and N are natural numbers), each including memory transistors (MTr0*mn* to MTr3*mn*) as well as selection transistors SSTrmn and SDTrmn. In FIG. 2, for example, consider that M=4, N=4 (m=0 to 3, n=0 to 3), and the number of laminated word lines WL p=4, then a total of 64 memory transistors MTr are formed in one memory cell block, including 4×4=16 memory transistors in the planar direction and 4 memory transistors in the lamination direction. However, the present invention is not so limited.

The word lines (WL0 to WL3) that are connected to the gates of the memory transistors (MTr0*mn* to MTr3*mn*) in respective memory strings MS are formed by the same conductive film and commonly used therein. That is, in respective memory strings MS, all gates of the memory transistors MTr0*mn* are connected to the word line WL0. In addition, in respective memory strings MS, all gates of the memory transistors MTr1*mn* are connected to the word line WL1. In addition, in respective memory strings MS, all gates of the memory transistors MTr2*mn* are connected to the word line WL2. In addition, in respective memory strings MS, all gates of the memory transistors MTr3*mn* are connected to the word line WL3.

As illustrated in FIGS. 1 and 2, in the non-volatile semiconductor storage device 100 according to the first embodiment, the word lines WL0 to WL3 are each formed to expand in a two-dimensional manner and have a planar plate-like structure for each memory cell block. In addition, the word lines WL0 to WL3 are arranged substantially vertical to the respective memory strings MS.

Each of the memory strings MS has columnar semiconductors CLmn (m=0 to 3, n=0 to 3) of a columnar shape that are formed to extend in a vertical direction to a semiconductor substrate Ba. The columnar semiconductors CLmn function as body parts (channel formation parts) of respective memory transistors MTr. As described below, gate insulation films (not illustrated in FIG. 2) that include electric charge accumulation films providing data retaining parts are formed around the columnar semiconductors CLmn. The word lines WL are formed via the gate insulation films.

The columnar semiconductors CLmn are formed to extend in a vertical direction to the semiconductor substrate Ba, and arranged in a matrix form on the respective surfaces of the semiconductor substrate Ba and the word lines (WL0 to WL3). This means that the memory strings MS are also arranged in a matrix form within a plane vertical to the columnar semiconductors CLmn. Note that the columnar semiconductors CLmn may have columnar or prismatic shapes. In addition, the columnar semiconductors CLmn include columnar semiconductors having terraced shapes.

Furthermore, as illustrated in FIG. 2, drain-side selection transistors SDTrmn are formed at the upper portions of the memory strings MS. Each of the drain-side selection transistors SDTrmn comprises: a columnar semiconductor CLmnd that is formed in contact with the upper end of a respective columnar semiconductor CLmn; a gate insulation film (second gate insulation film, not illustrated in FIG. 2) that is formed to cover a circumference of the columnar semiconductor CLmnd; and a drain-side selection gate line SGDm (m=0 to 3) that comes in contact with the columnar semiconductor CLmnd via the gate insulation film. The drain-side selection gate lines SGDm are formed with the row direction taken as their longitudinal direction, and insulated and isolated from each other in the column direction. Unlike the word lines WL0 to WL3, the drain-side selection gate lines SGDm are formed in a stripe pattern parallel to the semiconductor substrate Ba. In addition, a columnar semiconductor layer CLmnd is provided to penetrate the center in the width direction of a respective drain-side selection gate line SGD.

Furthermore, as illustrated in FIG. 2, source-side selection transistors SSTrmn are formed at the lower portions of the memory strings MS. Each of the source-side selection transistors SSTrmn comprises: a columnar semiconductor CLmns that is formed in contact with the lower end of a respective columnar semiconductor CLmn; a gate insulation film (third gate insulation film, not illustrated in FIG. 2) that is formed to cover a circumference of the columnar semiconductor CLmns; and a source-side selection gate line SGSm (m=0 to 3) that comes in contact with the columnar semiconductor CLmns via the gate insulation film.

As in the drain-side selection gate lines SGDm, the source-side selection gate lines SGSm are formed with the row direction taken as their longitudinal direction, and insulated and isolated from each other in the column direction. The source-side selection gate lines SGSm are also formed in a stripe pattern parallel to the semiconductor substrate Ba. In addition, a columnar semiconductor layer CLmns is provided to penetrate the center in the width direction of a respective source-side selection gate line SGSm.

Furthermore, a plurality of source lines SLm (m=0 to 3) are formed on the semiconductor substrate Ba that are connected to the lower ends of the columnar semiconductors CLmns, using a method such as ion implantation of impurity into the semiconductor substrate Ba. The source lines SLm are formed in a line-and-space pattern, with the row direction taken as their longitudinal direction, as in the drain-side selection gate lines SGDm and the source-side selection gate lines SGSm. That is, device isolation/insulation films 61 are formed between the source lines SLm, providing insulation and isolation between these source lines SLm. Thus, the multiple source lines SLm are controlled independently by the above-mentioned source-line driving circuit 17.

The voltage of the source line SLm, to which one of the memory strings MS is connected that is selected to be erased by a data erase operation, is boosted to a certain erase voltage by the source-line driving circuit 17. On the other hand, the voltages of the source lines SLm, to which unselected memory strings MS are connected, are controlled by the source-line driving circuit 17, e.g., to be the same voltage as the initial value before the erase operation begins, e.g., the ground voltage VSS (0V). This will be described in detail below. In this case, as an example, while the source lines SLm are formed in the semiconductor substrate Ba so as to be insulated and isolated from each other, they may be formed by patterning, as in the selection gate lines SGSm, SGDm, and so on.

Each memory transistor MTrmn includes: a columnar semiconductor CLmn; an insulation film (e.g., an ONO film) surrounding the columnar semiconductor CLmn and having an electric charge accumulation layer; and a word line WL surrounding the insulation film. One end of the word line WL that comes in contact with the electric charge accumulation layer via the insulation film functions as the control gate electrode CG of the memory transistor MTrmn.

In the non-volatile semiconductor storage device 100 with the above-mentioned configuration, the voltages of the bit lines BL0 to BL3, the drain-side selection gate lines SGD0 to 3, the word lines WL0 to WL3, the source-side selection gate lines SGS0 to 3, and the source lines SL0 to 3 are controlled by a bit-line driving circuit (not illustrated), the word-line driving circuit 13, the source-side selection gate line driving circuit 14, the drain-side selection gate line driving circuit 15, and the source-line driving circuit 17, respectively. That is, data is read, written and erased by controlling the electric charge of the electric charge accumulation layer in a certain memory transistor MTr.

Figure 4:
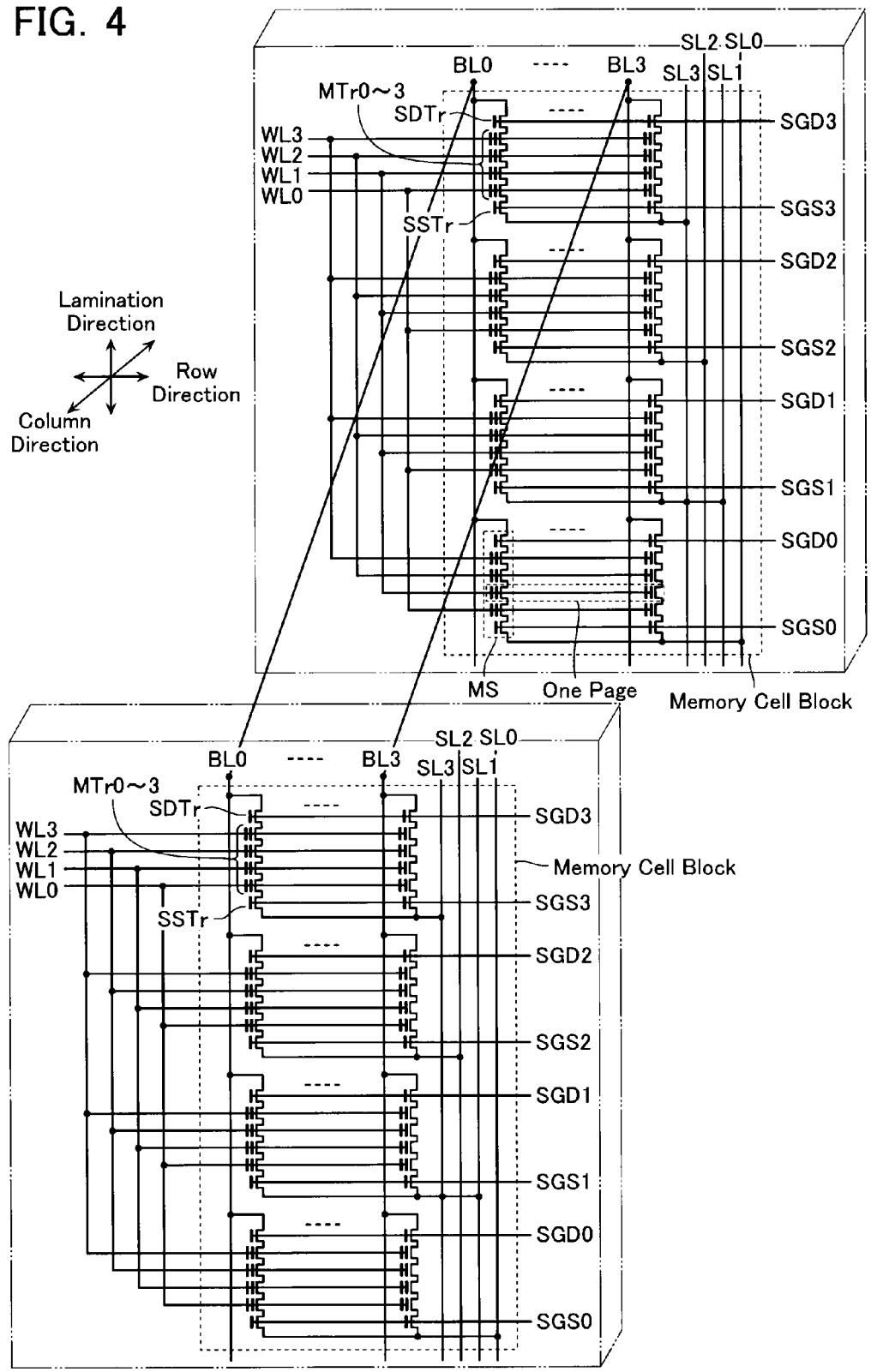
FIG. 4 illustrates an equivalent circuit of the memory transistor area 12 in one memory cell block.

FIG. 4 is an equivalent circuit diagram of the memory transistor area 12 in one memory cell block. As illustrated in FIG. 4, 4×4=16 memory strings MS are arranged in a matrix form on the semiconductor substrate Ba in each memory cell block, so as to extend in a vertical direction to the semiconductor substrate Ba. In addition, the sixteen memory transistors MTrimn (i=0 to 3) that are located at the same layer (height) are all connected to the same word line WLi. In addition, the (four) memory strings MS that are aligned in the row direction, the source-side selection transistors SSTr and the drain-side selection transistors SDTr are connected to the same source line SLm, source-side selection gate line SGSm, and drain-side selection gate line SGDm. Note that the source lines SL0 to SL3 are shared between a plurality of memory cell blocks, as described below. Four memory transistors MTrimn in four memory strings MS arranged in a row in the row direction that are connected to the same word line WLi are included in one page (see FIG. 4), which represents a minimum unit of data erase operation. That is, data is collectively erased from the four memory transistors MTr included in this one page, while data is not erased from the other memory transistors MTr.

(Specific Configuration of Memory Strings MS in First Embodiment)

Figure 5:
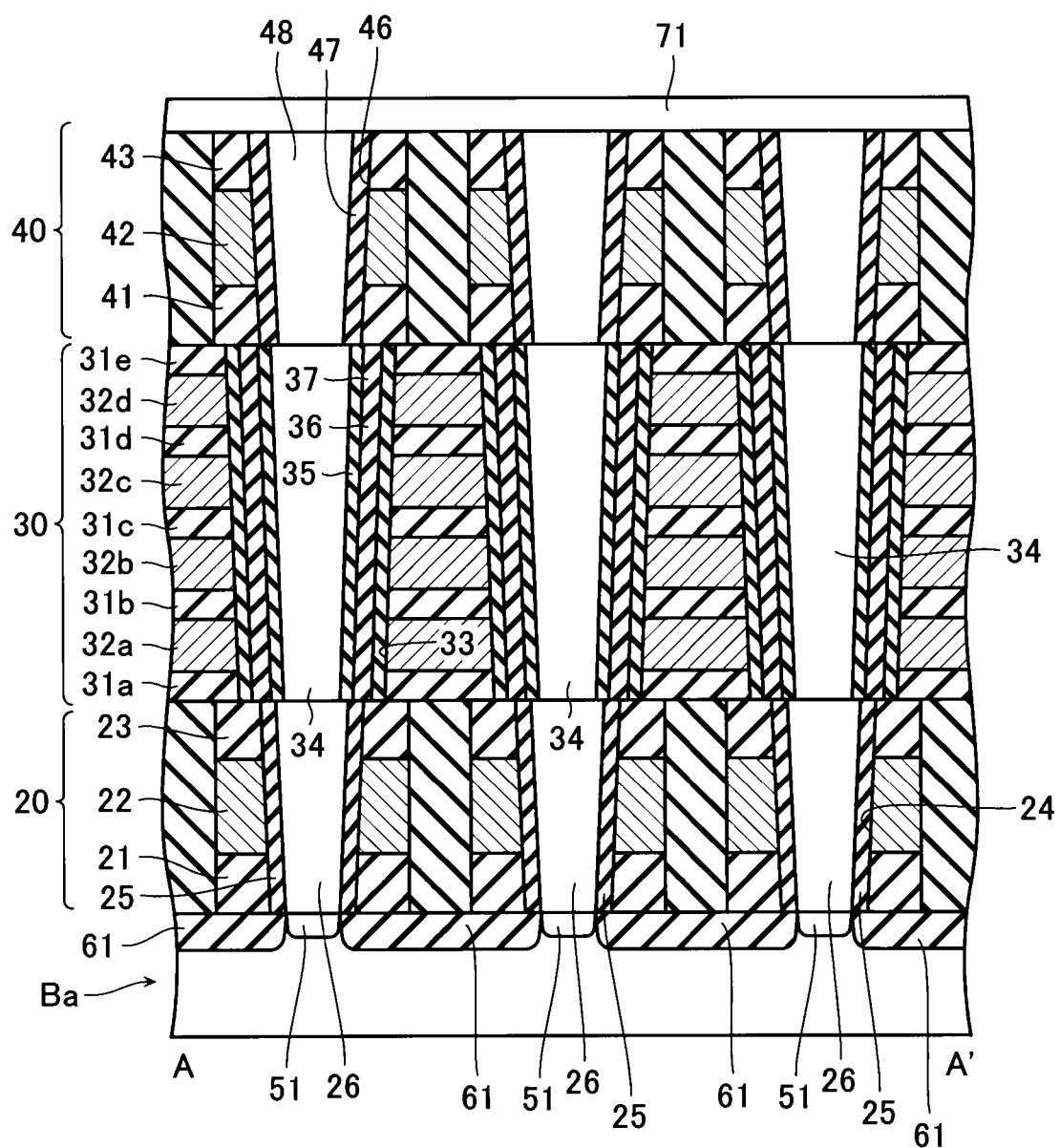
FIG. 5 is a cross-sectional view taken along line A-A' of FIG. 2.
Figure 6:
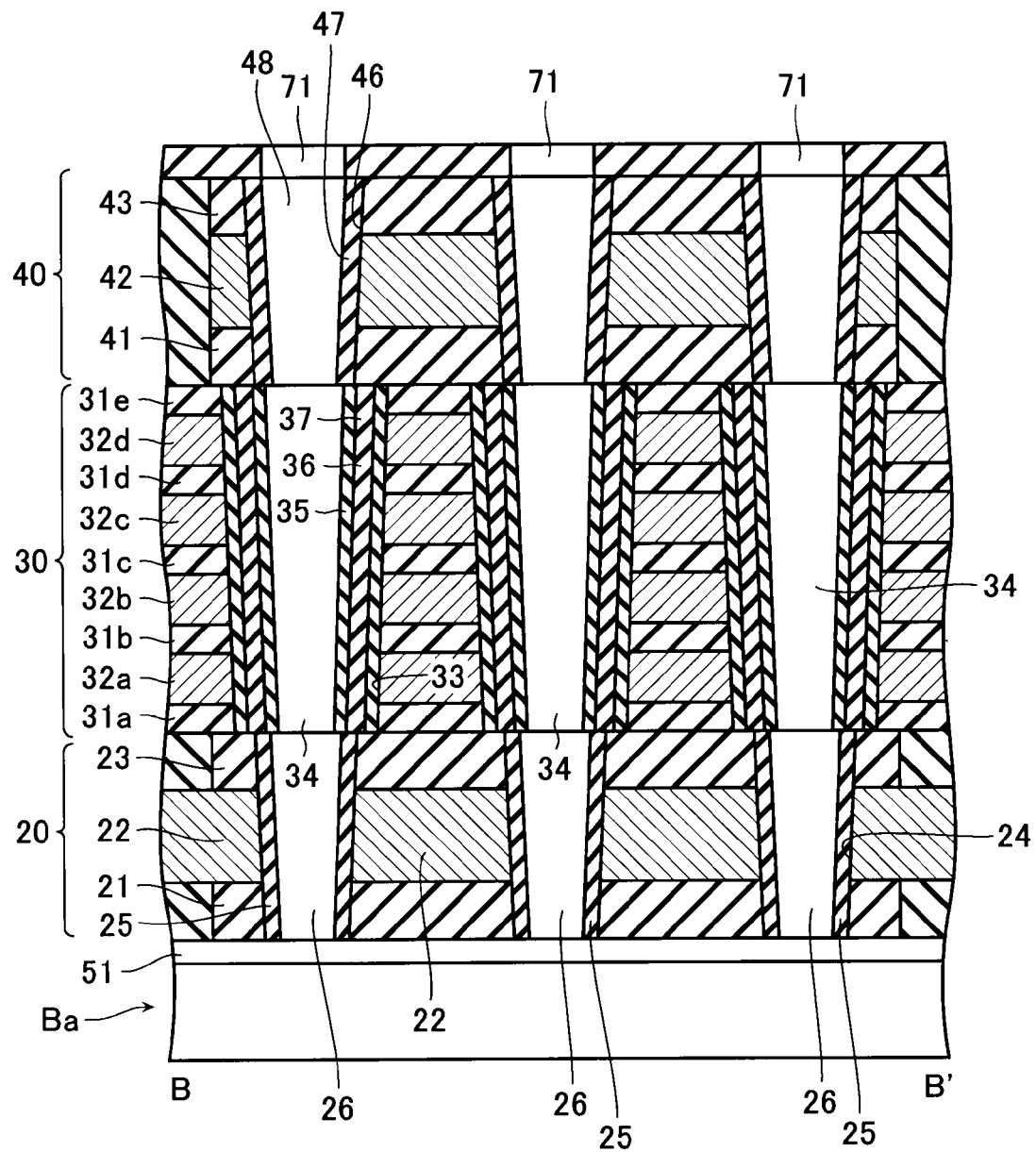
FIG. 6 is a cross-sectional view taken along line B-B' of FIG. 2.

Referring now to FIGS. 5 and 6, a specific configuration of the memory strings MS will be further described below. FIG. 5 is a cross-sectional view taken along line A-A' of FIG. 2. FIG. 6 is also a cross-sectional view taken along line B-B' of FIG. 2.

As illustrated in FIGS. 5 and 6, the memory strings MS has a source-side selection transistor layer 20, a memory transistor layer 30, and a drain-side selection transistor layer 40, in order of the lower to upper layers. The source-side selection transistor layer 20 functions as source-side selection transistors SSTrmn. The memory transistor layer 30 functions as memory transistors MTrmn. The drain-side selection transistor layer 40 functions as drain-side selection transistors SDTrmn.

The source-side selection transistor layer 20 has source-side first insulation layers 21 formed on the semiconductor substrate Ba, source-side conductive layers (gate conductive layer) 22 formed on the top surfaces of the source-side first insulation layers 21, and source-side second insulation layers 23 formed on the top surfaces of the source-side conductive layers 22. The source-side first insulation layers 21 and the source-side second insulation layers 23 comprise, e.g., silicon oxide. In addition, the source-side conductive layers 22 comprise, e.g., polysilicon. Note that the source-side conductive layers 22 function as the control gates of the above-mentioned selection transistors SSTrmn.

The source-side selection transistor layer 20 also has source-side holes 24 that are formed to penetrate the source-side first insulation layers 21, the source-side conductive layers 22, and the source-side second insulation layers 23. A source-side columnar semiconductor layer (gate columnar semiconductor) 26 is provided in each source-side hole 24 via a source-side gate insulation layer 25. The source-side gate insulation layers 25 are formed by, e.g., silicon oxide. The source-side columnar semiconductor layers 26 are formed by, e.g., amorphous silicon.

The memory transistor layer 30 has first to fifth inter-wordline insulation layers 31a to 31e that are provided above the source-side second insulation layers 23, and first to fourth word-line conductive layers 32a to 32d that are provided above or below the first to fifth inter-wordline insulation layers 31a to 31e, respectively. The first to fifth inter-wordline insulation layers 31a to 31e comprise, e.g., silicon oxide. In addition, the first to fourth word-line conductive layers 32a to 32d comprise, e.g., polysilicon. The first to fourth word-line conductive layers 32a to 32d function as the above-mentioned word lines WL0 to WL3.

The memory transistor layer 30 also has memory holes that are formed to penetrate the first to fifth inter-wordline insulation layers 31a to 31e and the first to fourth word-line conductive layers 32a to 32d, and memory columnar semiconductor layers 34 that are formed in the memory holes 33. The memory columnar semiconductor layers 34 are formed by amorphous silicon.

Furthermore, the memory transistor layer 30 has tunnel insulation layers 35 that come in contact with the memory columnar semiconductor layers 34, electric charge accumulation layers 36 that come in contact with the tunnel insulation layers 35 and accumulate electric charges, and block insulation layers 37 that come in contact with the electric charge accumulation layers 36. The block insulation layers 37 also come in contact with the first to fourth word-line conductive layers (memory conductive layers) 32a to 32d. The tunnel insulation layers 35 are formed by silicon oxide. The electric charge accumulation layers 36 are formed by silicon nitride (SiN). The block insulation layers 37 are formed by silicon oxide. Note that the electric charge accumulation layers 36 may be only formed at those positions between the first to fourth word-line conductive layers 32a to 32d and the memory columnar semiconductor layers 34, and not between the first to fifth inter-wordline insulation layers 31a to 31e and the memory columnar semiconductor layers 34.

The drain-side selection transistor layer 40 has first isolation/insulation layers 41 that are formed on the fifth inter-wordline insulation layer 31e, drain-side conductive layers (gate conductive layers) 42 that are formed on the top surfaces of the first isolation/insulation layers 41, and second isolation/insulation layers 43 that are formed on the top surfaces of the drain-side conductive layers 42. The first isolation/insulation layers 41 and the second isolation/insulation layers 43 are formed by silicon oxide. The drain-side conductive layers 42 are formed by polysilicon. Note that the drain-side conductive layers 42 function as the control gates of the above-mentioned selection transistors SDTrmn.

The drain-side selection transistor layer 40 also has drain-side holes 46 that are formed to penetrate the first isolation/insulation layers 41, the drain-side conductive layers 42, and the second isolation/insulation layers 43. A drain-side columnar semiconductor layer (gate columnar semiconductor) 48 is formed in each drain-side hole 46 via a drain-side gate insulation layer 47. Note that conductive layers 71 are formed in a stripe pattern on the upper ends of the drain-side columnar semiconductor layers 48. The conductive layers 71 function as bit lines BLn. The drain-side gate insulation layers 47 are formed by silicon oxide. The drain-side columnar semiconductor layers 48 are formed by amorphous silicon.

N-type diffusion layers 51 are formed on the semiconductor substrate Ba that function as source lines SL. The multiple n-type diffusion layers 51 are formed in a stripe pattern, with the same direction as the longitudinal direction of the drain-side selection gate lines (SGD) taken as their longitudinal direction. The voltages of the multiple source lines SLm, i.e., the n-type diffusion layers 51, are controlled independently by the source-line driving circuit 17. In addition, the n-type diffusion layers 51 are sandwiched between device isolation/insulation films 61, providing insulation and isolation between the n-type diffusion layers 51. The device isolation/insulation films 61 are also formed in a stripe pattern, as in the n-type diffusion layers 51.

Figure 7:
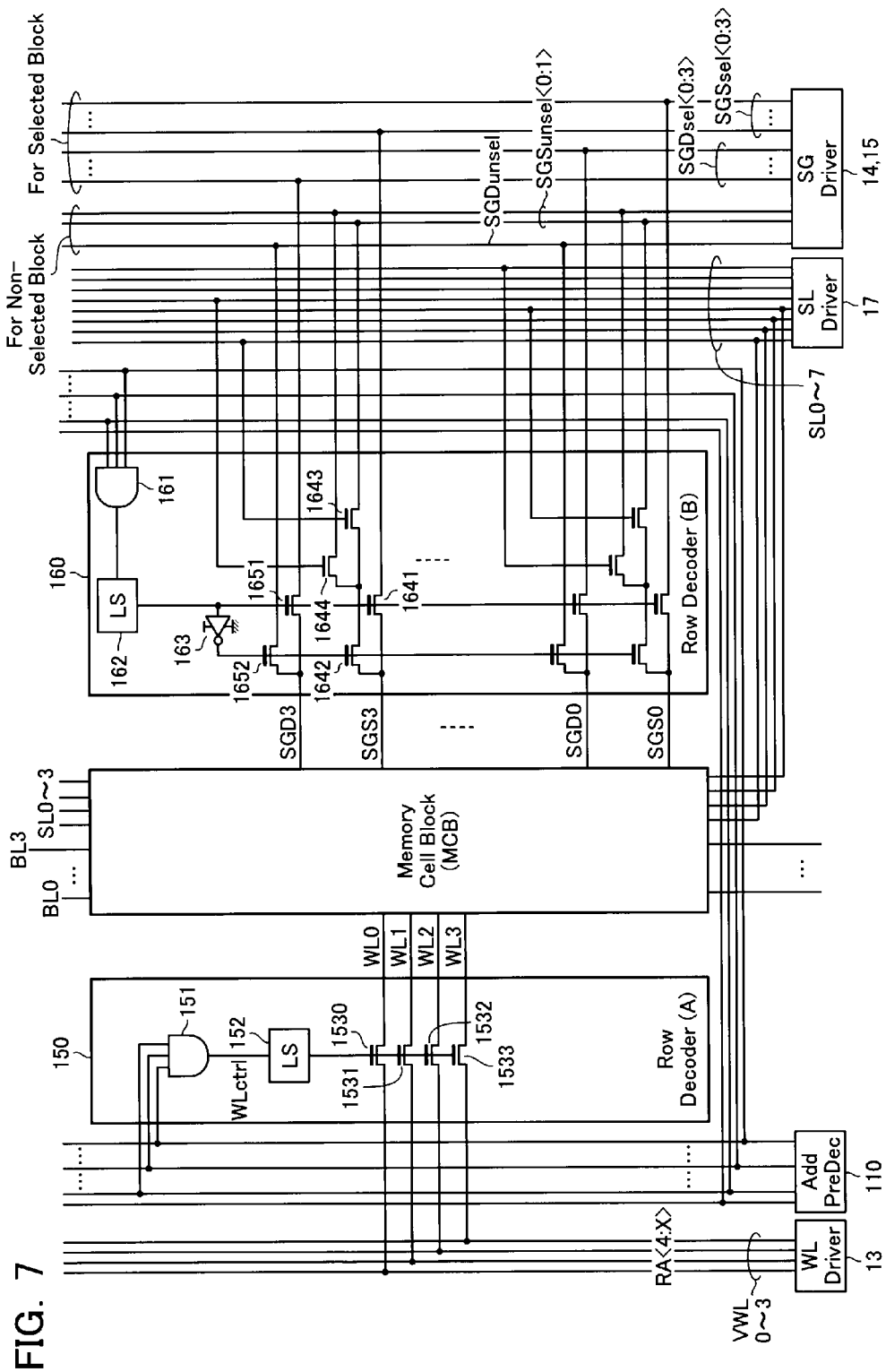
FIG. 7 illustrates an exemplary configuration of row decoders 150 and 160 provided for each memory cell block.

FIG. 7 illustrates an exemplary configuration of row decoders 150 and 160 that are provided for each memory cell block MCB. As illustrated in FIG. 7, the memory transistors and the selection transistors included in one memory cell block in the memory transistor area 12 may be controlled by the row decoders 150 and 160 having a configuration as illustrated in FIG. 7.

The row decoder 150 is a circuit that selectively supplies drive signal lines VWL0 to 3 from the word-line driving circuit 13 to the word lines WL0 to 3, according to address signals from an address predecoder 110.

The row decoder 160 supplies, according to address signals from the address predecoder 110 and signals output from the source-line driving circuit 17, voltages to the source-side selection gate lines SGSm and the drain-side selection gate lines SGDm, the voltages being output from the source-side selection gate line driving circuit 14 and the drain-side selection gate line driving circuit 15 via the drive signal lines (SGDsel<0:3>, SGSsel<0:3>, SGDunsel, and SGSunsel<0:1>).

The row decoder 150 comprises a logic gate 151, a level shifter 152, and transistors 1530 to 1533. The logic gate 151 outputs a signal WLctrl based on address signals RA<4:X> supplied by the address predecoder 110. The transistors 1530 to 1533 perform on/off operations when a signal amplified by the level shifter 152 is supplied to their gates. As a result, a voltage depending on the address of a selected memory transistor MTrmn is supplied to the word lines WL0 to WL3 from the word-line driving circuit 13.

In addition, the row decoder 160 comprises transistors 1641 to 1644 each of which are provided for each source-side selection gate line SGSm.

The transistor 1641 is brought into a conductive state if the corresponding memory cell block is selected, and when drive signals SGSsel<0:3> are selectively supplied to the corresponding source-side selection gate line SGSm from the source-side selection gate line driving circuit 14. Any one of the drive signals SGSsel<0:3> is only set to "H" and the other three are set to "L".

In addition, each transistor 1642 is brought into a conductive state if the corresponding memory cell block is unselected, and when drive signals SGSunsel<0:1> are selectively supplied to the source-side selection gate lines SGSm from the source-side selection gate line driving circuit 14. The address signals RA<4:X> supplied from the address predecoder 110 are supplied to an AND gate 161. The output signal of the AND gate 161 is then supplied to a level shifter 162. The transistors 1641 and 1642 are controlled by the output signal of the level shifter 162 and the inverted signal thereof (the output signal of an inverter 163). Accordingly, one of the transistors 1641 and 1642 is only brought into a conductive state and the other into a non-conductive state.

Any one of the transistors 1643 and 1644 is selectively placed to a conductive state and the other to a non-conductive state. Thus, when the corresponding memory cell block is unselected, any one of SGSunsel<0:1> is supplied to the source-side selection gate line SGSm. Which one is supplied depends on whether the source-side selection transistor SSTr is connected to the selected source line SL or to an unselected source line.

Each transistor 1651 is brought into a conductive state if the corresponding memory cell block is selected, and when drive signals SGDsel<0:3> are selectively supplied to the corresponding drain-side selection gate line SGDm from the drain-side selection gate line driving circuit 15. Any one of the drive signals SGDsel<0:3> is only set to "H" and the other three are set to "L".

In addition, each transistor 1652 is brought into a conductive state if the corresponding memory cell block is unselected, and when drive signals SGDunsel are selectively supplied to the drain-side selection gate line SGDm from the drain-side selection gate line driving circuit 15.

Figure 8:
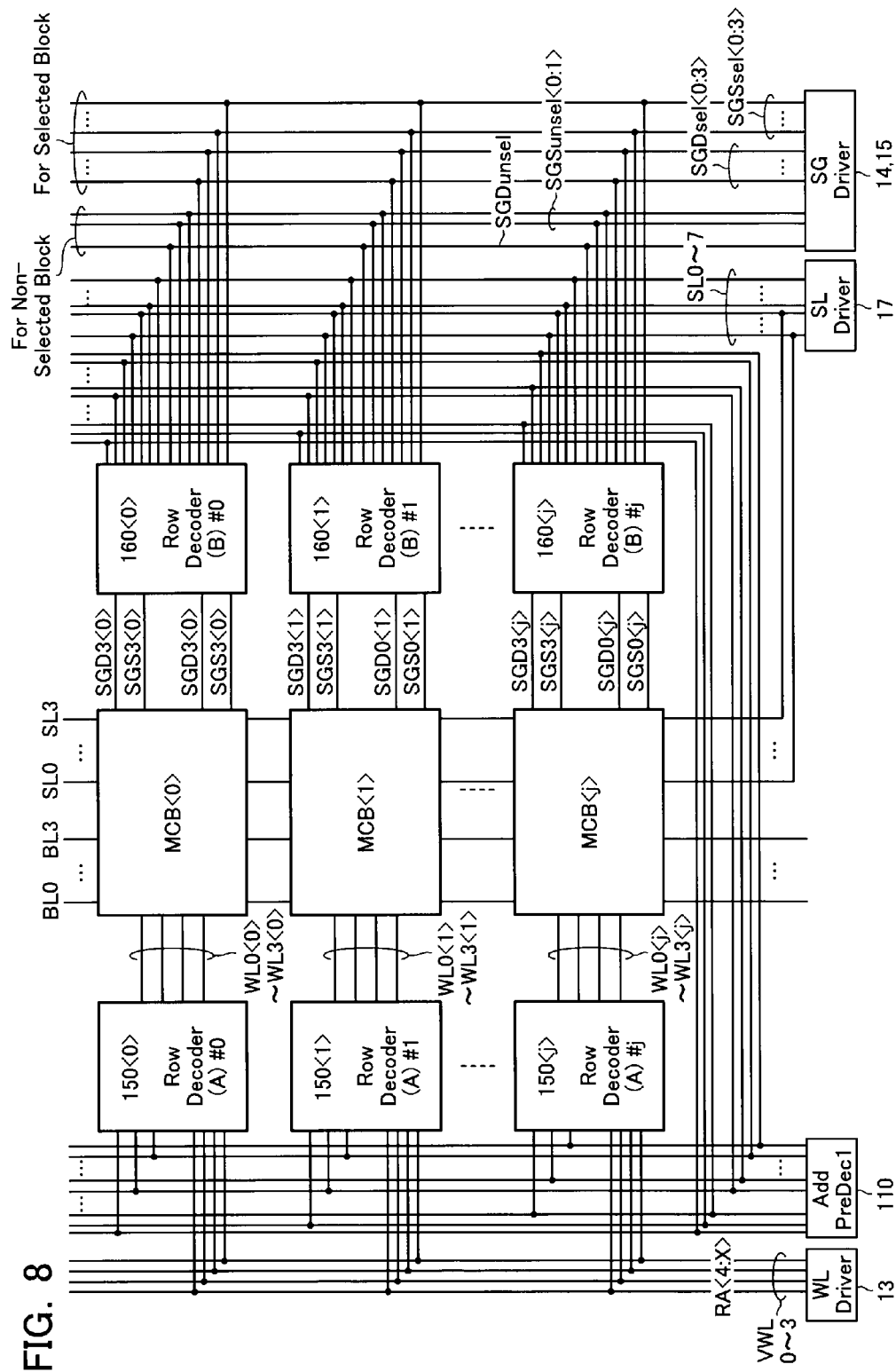
FIG. 8 illustrates an exemplary arrangement of a plurality of memory cell blocks MCB<0> to <j> and respective row decoders 150 and 160 provided correspondingly thereto.

The memory cell array has a plurality of memory cell blocks MCB<0>, MCB<1>, ..., MCB<j>. As illustrated in FIG. 8, the row decoders 150 and 160 as illustrated in FIG. 7 are disposed for each of the memory cell blocks MCB<0>, MCB<1>, ..., MCB<j>. In addition, the source lines SL0 to SL3 are shared by the plurality of memory cell blocks MCB<0>, MCB<1>, ..., MCB<j>.

[Word-Line Driving Circuit 13]

Figure 9:
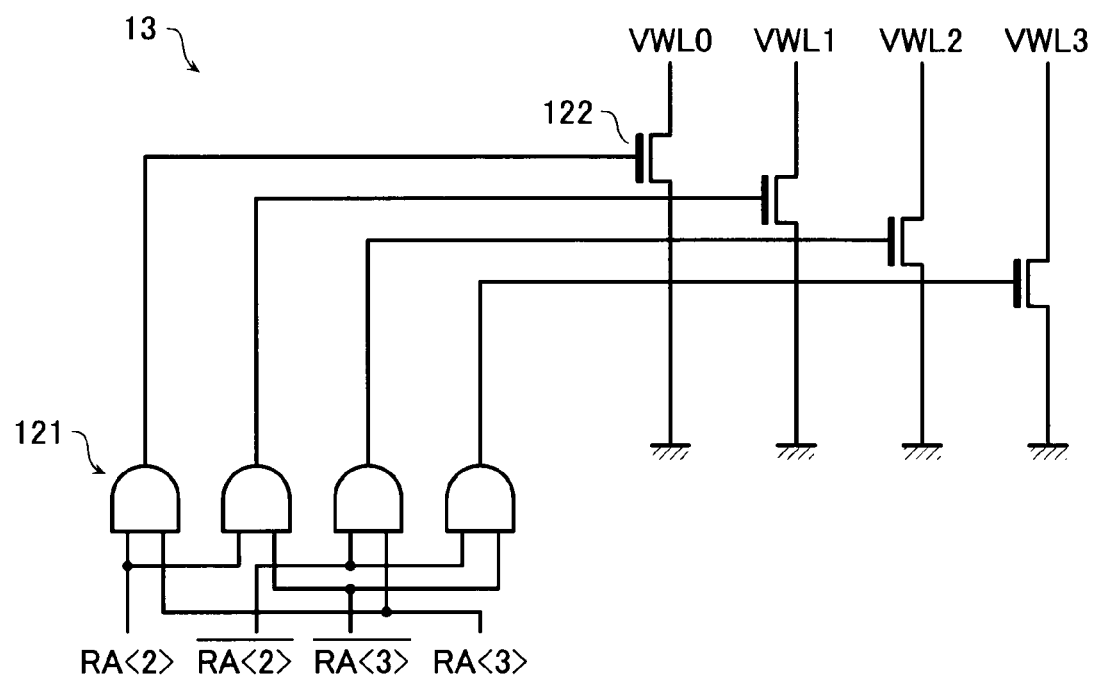
FIG. 9 is a circuit diagram illustrating an example of a specific configuration of the word-line driving circuit 13.

Referring now to FIG. 9, an example of a specific configuration of the word-line driving circuit 13 will be described below. FIG. 9 illustrates one part of the configuration of the word-line driving circuit 13 that is responsible for data erase operation. This configuration allows only one of the word lines WL0 to 3 to be selectively set at the ground voltage VSS and the others to be in a floating state in data erase operation. The configuration of the word-line driving circuit 13 for data read/write operations may be the same as the well known configuration and will not be described in greater detail.

As illustrated in FIG. 9, the word-line driving circuit 13 comprises a selection signal generation unit 121 and transistors 122. The selection signal generation unit 121, which has four AND gates, sets only an output signal of one of the four AND gates to "H" and the other output signals to "L" based on 2-bit row address signals RA<2>, RA<3>, /RA<2>, /RA<3>. As a result, only one of the four transistors 122 is controlled to turn on and the remaining three to turn off. Consequently, only one of four drive signal lines VWL0 to 3 is set at the ground voltage VSS and the remaining three are made floating.

[Source-Line Driving Circuit 17]

Figure 10:
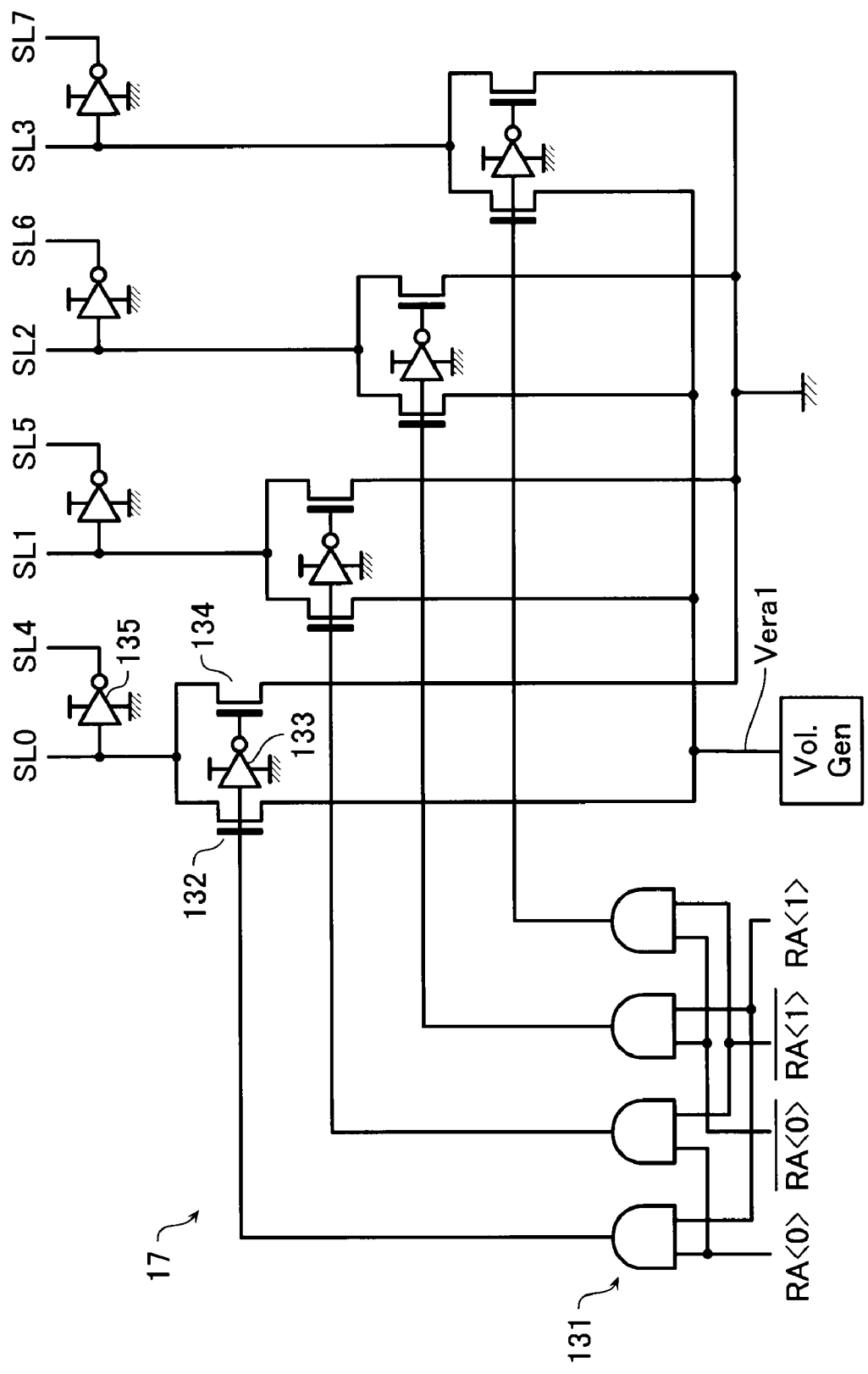
FIG. 10 is a circuit diagram illustrating a specific configuration of the source-line driving circuit 17.

FIG. 10 illustrates an example of a specific configuration of the source-line driving circuit 17. This configuration allows an erase voltage Vera1 (on the order of 20V) to be selectively supplied to only one of the source lines SL0 to 3 and the ground voltage VSS to the others in data erase operation.

The source-line driving circuit 17 comprises a selection signal generation unit 131, transistors 132, inverters 133, transistors 134, and inverters 135. The transistor 132, the inverter 133, the transistor 134, and the inverter 135 are provided for each of the source lines SL0 to 3.

The selection signal generation unit 131, which has four AND gates, sets only one of output signals RADEC0 to 3 of the four AND gates to "H" and the others to "L" based on 2-bit row address signals RA<0>, RA<1>, /RA<0>, /RA<1>. As a result, only one of the four transistors 132 is controlled to turn on and the remaining three to turn off. In addition, the four transistors 134 are controlled by the inverters 133 so that only one of the transistors 134 turns on and the remaining three turn off.

One end of the transistors 134 is connected to the ground terminals, and one end of the transistors 132 is provided with the erase voltage Vera1. Accordingly, only one of the source lines SL0 to 3 is provided with the erase voltage Vera1 and the remaining three are provided with the ground voltage VSS. On the other hand, source lines SL4 to 7 are provided, each of which corresponds to the respective source lines SL0 to 3. The source lines SL4 to 7 are provided with the complementary signals of the signals of the respective source lines SL0 to 3 from the inverters 135. That is, a source line SLk+4 (k=0 to 3) is set to "L" (VSS) when the source line SLk is in "H" (Vera1), and set to "H" when the source line SLk is in "L".

[Source/Drain-Side Selection Gate Line Driving Circuits 14 and 15]

Figure 11:
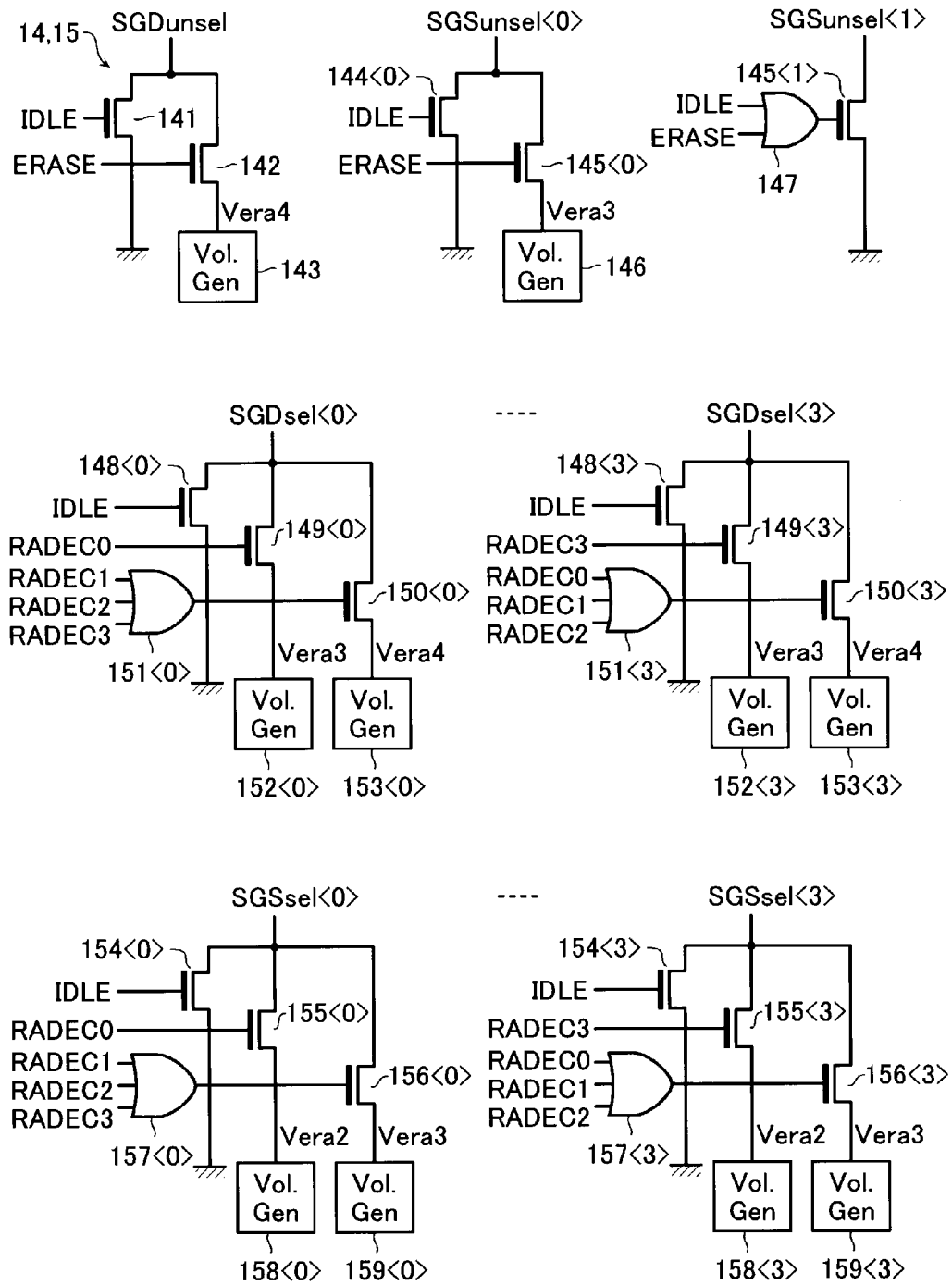
FIG. 11 is a circuit diagram illustrating an example of a specific configuration of the source-side selection gate line driving circuit 14 and the drain-side selection gate line driving circuit 15.

Referring now to FIG. 11, an example of a specific configuration of the source-side selection gate line driving circuit 14 and the drain-side selection gate line driving circuit 15 will be described below. FIG. 11 also illustrates one part of the circuit configuration for data erase operation. The configuration for data read/write operations may also be the same as the well known configuration and description thereof will be omitted.

As illustrated on the upper part of FIG. 11, this driving circuit comprises transistors 141, 142, a voltage generation circuit 143, transistors 144<0>, 145<0>, 145<1>, a voltage generation circuit 146, and an OR gate 147 as the configuration for controlling voltage of drive signal lines SGDunsel and SGSunsel<0:1>.

The transistor 141, which is connected between the ground terminal and the drive signal line SGDunsel, is on/off controlled by a signal IDLE being supplied to its gate. The signal IDLE is a signal that is set to "L" when an erase operation is performed and that is set to "H" otherwise. In addition, the transistor 142, which is connected between the output terminal (output voltage Vera4=on the order of 16V) of the voltage generation circuit 143 and the drive signal line SGDunsel, is on/off controlled by a signal ERASE being supplied to its gate. The signal ERASE is a signal that is set to "H" when an erase operation is performed and that is set to "L" otherwise.

The transistor 144<0>, which is connected between the ground terminal and the drive signal line SGSunsel<0>, is on/off controlled by a signal IDLE being supplied to its gate. In addition, the transistor 145<0>, which is connected between the output terminal (output voltage Vera3=on the order of 18V) of the voltage generation circuit 146 and the drive signal line SGSunsel<0>, is on/off controlled by a signal ERASE being supplied to its gate. In addition, the transistor 145<1>, which is connected between the ground terminal and the drive signal line SGSunsel<1>, is on/off controlled by an output signal of the OR gate 147 being supplied to its gate. The above-mentioned signals IDLE and ERASE are input to the input terminal of the OR gate 147, which in turn outputs the logical OR signal of these signals.

The driving circuit illustrated in FIG. 11 also comprises transistors 148<i>, 149<i>, 150<i>, OR gates 151<i>, and voltage generation circuits 152<i>, 153<i> as the configuration for controlling voltage of drive signal lines SGDsel<i> (i=0 to 3). The transistors 148<i>, which are connected between the ground terminal and the drive signal lines SGDsel<i>, are on/off controlled based on the signal IDLE. In addition, the transistors 149<i>, which are connected between the output terminals (voltage Vera3=on the order of 18V) of the voltage generation circuits 152<i> and the drive signal lines SGDsel<i>, are on/off controlled based on the above-mentioned signals RADECi. Also, the transistors 150<i>, which are connected between the output terminals (voltage Vera4=on the order of 16V) of the voltage generation circuits 153<i> and the drive signal lines SGDsel<i>, are on/off controlled based on output signals of the OR gates 151<i>. Each of the OR gates 151<i> outputs the logical OR signal of any three of the above-mentioned signals RADEC0 to 3.

The driving circuit illustrated in FIG. 11 also comprises transistors 154<i>, 155<i>, 156<i>, OR gates 157<i>, and voltage generation circuits 158<i>, 159<i> as the configuration for controlling voltage of the drive signal lines SGSsel<i> (i=0 to 3). The transistors 154<i>, which are connected between the ground terminal and the drive signal lines SGSsel<i>, are on/off controlled based on the signal IDLE. In addition, the transistors 155<i>, which are connected between the output terminals (voltage Vera2=on the order of 15V) of the voltage generation circuits 158<i> and the drive signal lines SGSsel<i>, are on/off controlled based on the above-mentioned signals RADECi. Also, the transistors 156<i>, which are connected between the output terminals (voltage Vera3=on the order of 18V) of the voltage generation circuits 159<i> and the drive signal lines SGSsel<i>, are on/off controlled based on output signals of the OR gates 157<i>. Each of the OR gates 157<i> outputs the logical OR signal of any three of the above-mentioned signals RADEC0 to 3.

[Erase Operation]

Figure 12:
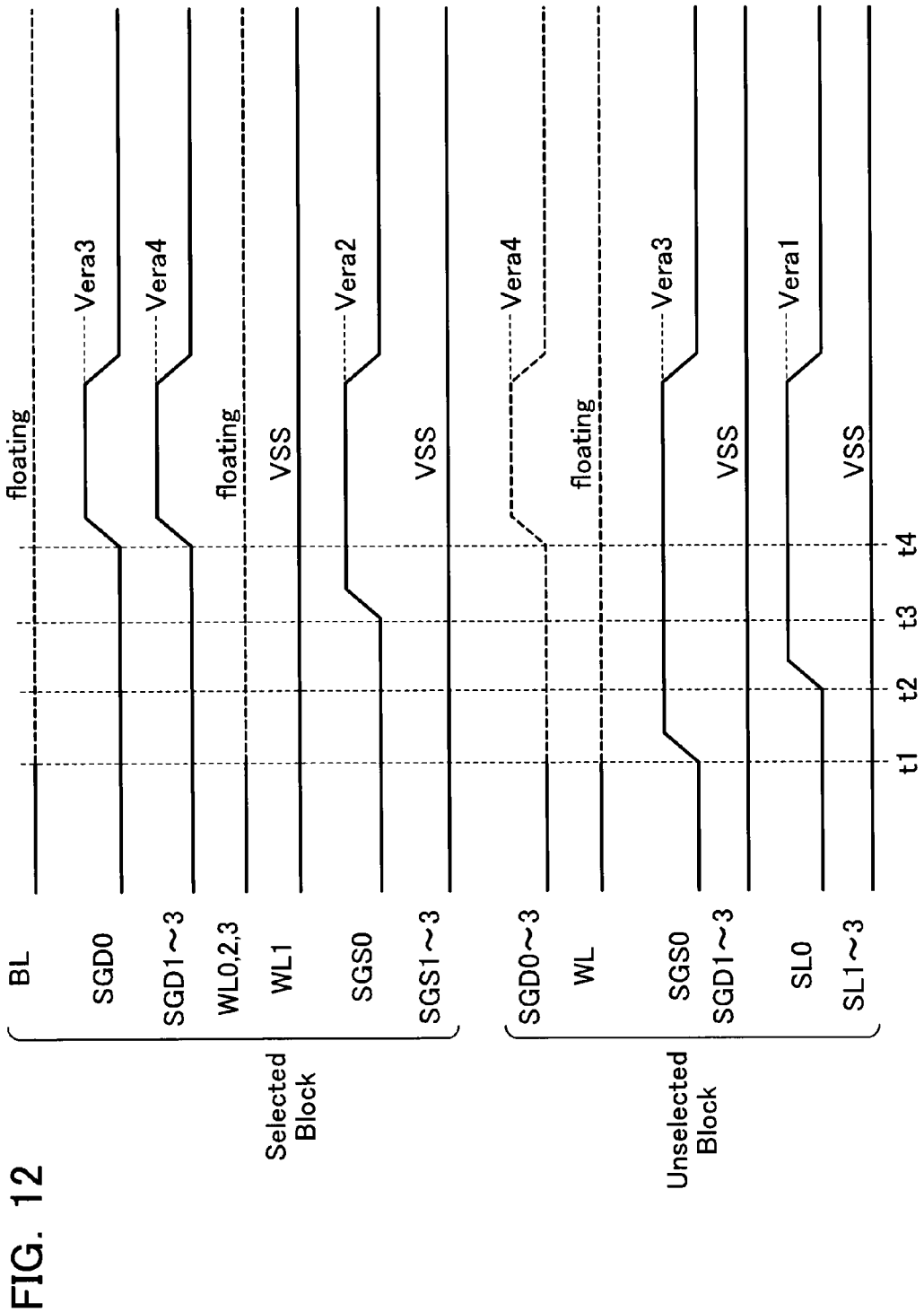
FIG. 12 is a timing chart illustrating an erase operation of the non-volatile semiconductor storage device 100 according to the first embodiment of the present invention.

Referring now to the timing chart of FIG. 12, an erase operation of the non-volatile semiconductor storage device 100 according to this embodiment will be described below. FIG. 12 illustrates the operations in the selected memory cell block (Selected Block) in which the memory cell to be erased is present, and in the other unselected memory cell blocks (Unselected Blocks).

At first, the description will be made focusing on the operation in the selected memory cell block. In this case, as illustrated in FIG. 4, consider that in a selected memory cell block, data of the memory transistors MTr1mn to MTr4nm in one page that are aligned along the word line WL1 is selected as the target for a collective erase operation, from among those memory transistors MTr in four memory strings MS connected to the source line SL0.

Firstly, prior to the erase operation, the word lines WL, the bit lines BL, the source lines SL, and the selection gate lines SGS, SGD are all initialized to the ground voltage VSS. At this point, it is preferable to perform the following procedures in order to ensure that the voltages of the body parts (columnar portions CLmn) of the respective memory strings MS are reduced to the ground voltage VSS. That is, the source-side selection gate lines SGS are boosted to a certain voltage with the source lines SL fixed to the ground voltage VSS. The certain voltage is then applied to the source-side selection transistors SSTr and all of the word lines. Then, the voltages of the word lines WL are reduced to the ground voltage. The word line WL that is farthest from the source lines SL is reduced to the ground voltage first, then the word line closer to the source line is selected next, and the word line closest to the source line SL is selected in the end, causing the respective memory transistors MTr to be cut off. As a result, the voltages of the body parts of the memory strings MS are reduced to the ground potential. Thereafter, the unselected word lines WL0, 2, 3 are switched to a floating state before the erase operation begins.

Subsequently, at time t2, in the selected memory cell block, the erase voltage Vera1 (on the order of 20V) is applied to the selected source line SL0, while the ground voltage VSS is applied to the other selected source lines SL1 to 3 as is the case with before the data erase operation begins. Thereafter, at time t3, delayed by a certain amount of time from time t2, only the source-side selection gate line SGS0 is boosted to the voltage Vera2 (on the order of 15V and lower than the voltage Vera1). As a result, a GIDL current (Gate induced Drain current, which is a hole current produced near the gate insulation layers of the source-side selection transistors SSTr due to a difference between the voltage Vera1 and the voltage Vera2) flows through those memory strings MS connected to the source line SL0. This GIDL current charges the body parts of the memory strings MS, in which the page to be erased is present, to a certain voltage (e.g., on the order of 19V).

Thereafter, at time t4, the voltages of the drain-side selection gate lines SGD0 to 3 are increased (SGD0 to the voltage Vera3=on the order of 18V, and SGD1 to 3 to the voltage Vera4=on the order of 16V). Once the GIDL current flows through the body parts of the memory strings MS and through the conductive drain-side selection transistors SDTr into the bit lines BL, the bit lines BL are charged to a high potential (e.g., 18V). Thus, if the drain-side selection gate line SGD0 has a low voltage, a GIDL current may be produced at the gate ends of the drain-side selection transistors SDTr. Therefore, in the first embodiment, the voltage Vera3 is applied to the drain-side selection gate line SGD0 at time t4, thereby preventing the occurrence of the GIDL current. For similar reasons, the voltages of the selection gate lines SGD1 to 3 are also set at voltages (e.g., 16V) that may prevent the occurrence of the GIDL current, considering the fact that the bit lines BL would have high voltages as described above.

On the other hand, the source-side selection gate lines SGS1 to 3 connected to the other memory strings MS (the memory strings connected to the source lines SL1 to 3) are maintained at the ground voltage VSS. Since the source lines SL1 to 3 are at the ground voltage VSS, no GIDL current flows through these memory strings MS (the memory strings in which the page to be erased is not present).

At this point, among the word lines WL0 to 3, the word line WL1 corresponding to the page to be erased is maintained at the ground voltage VSS (0V), while the other word lines WL0, WL2, WL3 being maintained in a floating state. As a result, holes based on the GIDL current are injected into the electric charge accumulation films of the memory transistors MTr along the word line WL1. This reduces the threshold voltages of the memory cell transistors MTr, and data is erased from these memory transistors. In contrast, the gate threshold voltages of the memory transistors MTr along the word lines WL0, WL2, WL3 that are made floating are increased due to coupling. Therefore, data is not erased from the memory transistors MTr along these word lines WL0, WL2, WL3.

On the other hand, in the unselected memory cell blocks, the source-side selection gate line SGS0 is boosted to the voltage Vera3 (on the order of 18V) at time t1 preceding time t2 when the voltage of the source line SL0 will be increased to the erase voltage Vera1 (the other source-side selection gate lines SGS1 to 3 are maintained at the ground voltage VSS). Thus, no GIDL current is produced in the unselected memory cell blocks. As such, this embodiment allows an erase operation to be performed on only one specific page (including a plurality of (in this case four) memory transistors MTr formed along one word line WL) in the selected memory cell block, while maintaining data in the other memory transistors MTr without being erased therefrom. Therefore, this embodiment may also reduce the number of memory transistors requiring rewrite operations, which allows for faster erase operations.

Second Embodiment

Figure 13:
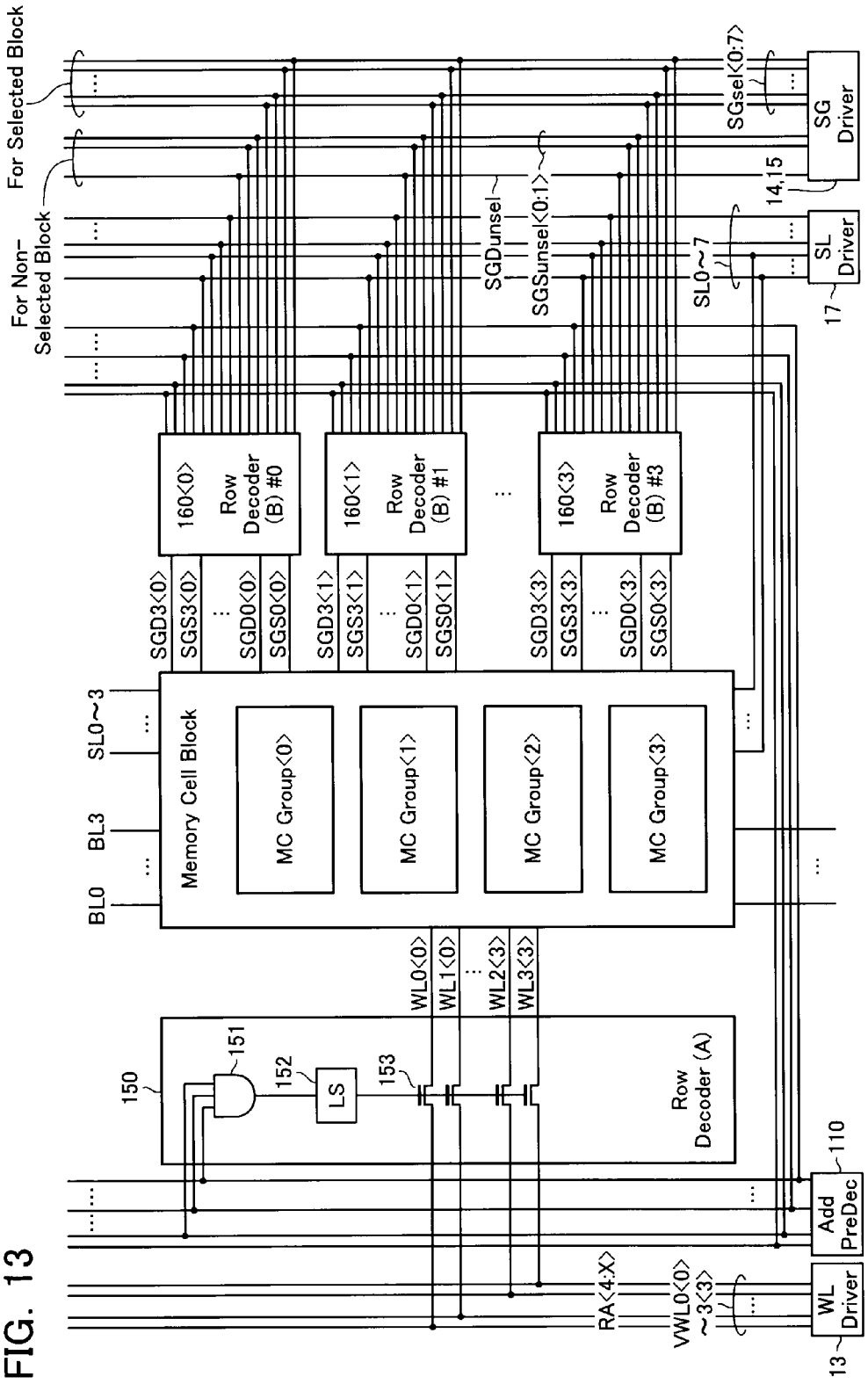
FIG. 13 is a schematic diagram illustrating a configuration of the non-volatile semiconductor storage device according to a second embodiment of the present invention.

Referring now to FIG. 13, the non-volatile semiconductor storage device 100 according to a second embodiment of the present invention will be described below. The non-volatile semiconductor storage device 100 of this embodiment has the same driving circuits 13, 14, 15, and 17 as the first embodiment.

FIG. 13 illustrates the configuration of one memory cell block MCB and row decoders 150 and 160 provided correspondingly to the memory cell block in the non-volatile semiconductor storage device 100 of the second embodiment. In this embodiment, one memory cell block MCB is further divided into smaller units, referred to as "memory cell groups" (memory cell groups MCGroup<0> to <3>). A plurality of word lines WL are disposed in each of the memory cell groups MCGroup. Each page formed along one of the word lines WL represents one unit for data erase operation.

Each memory cell group MCGroup<i> (i=0 to 3) shares four layers and four columns of sixteen word lines WL0<0>, WL1<0>, ..., WL3<2>, WL3<3> with the other memory cell groups MCGroup. As such, the multiple memory cell groups MCGroup<0> to <3> share one row decoder 150. Each memory cell group MCGroup<i> also comprises independent selection gate lines SGD0<i>, SGD1<i>, SGD2<i>, SGD3<i>, SGS0<i>, SGS1<i>, SGS2<i>, GS3<i>, that are driven by an independent row decoder 160<i>, respectively.

Figure 14:
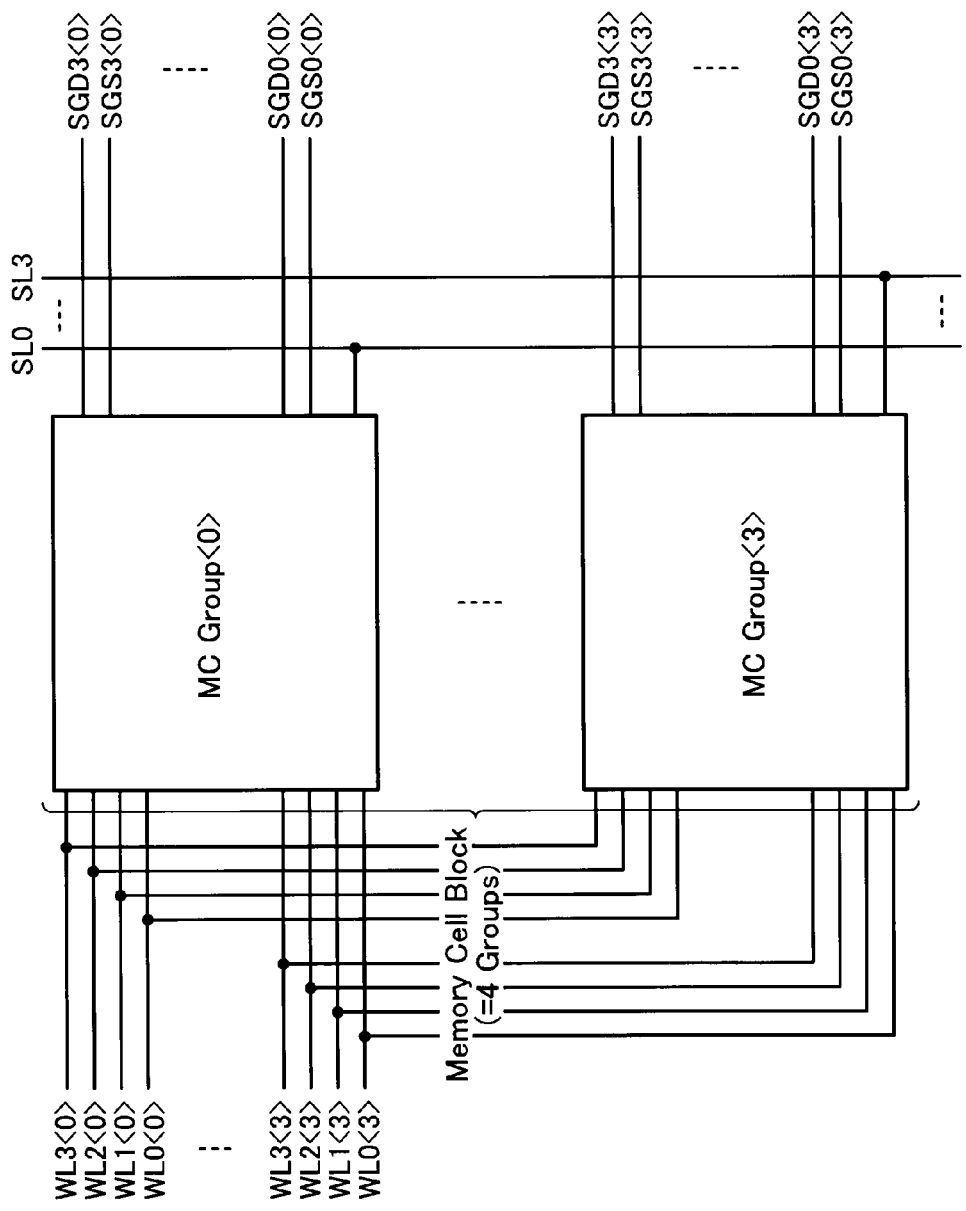
FIG. 14 is a wiring diagram of one memory cell block MCB including four memory cell groups MCGroup<0> to <3> in the non-volatile semiconductor storage device 100 according to the second embodiment of the present invention.

FIG. 14 is a wiring diagram of one memory cell block MCB including four memory cell groups MCGroup<0> to <3>. As illustrated in FIG. 14, one source line SLi is arranged in each memory cell group MCGroup<i>. When a data erase operation is performed, the source lines SL0 to 3 are controlled by the source-line driving circuit 17 so that any one of them is only set to "H" and the remaining ones are set to "L". As such, the erase operation is only performed on any one of the memory cell groups MCGroup<0> to <3>. Then, in one of the memory cell groups MCGroup that is selected as the target for the erase operation, the selection gate lines SGS, SGD are controlled independently of those of the other memory cell groups MCGroup. That is, each memory cell group MCGroup<i> has eight independent selection gate lines SGS0<i>, SGD0<i>, SGS1<i>, SGD1<i>, . . . , SGS3<i>, SGD3<i>. This allows an independent data erase operation to be performed on a certain page in one memory cell group MCGroup. In other words, an independent data erase operation may be performed for each memory cell group even if the word lines WL0<0> to WL3<3> are shared by a plurality of memory cell groups MCGroup<i>.

Figure 15:
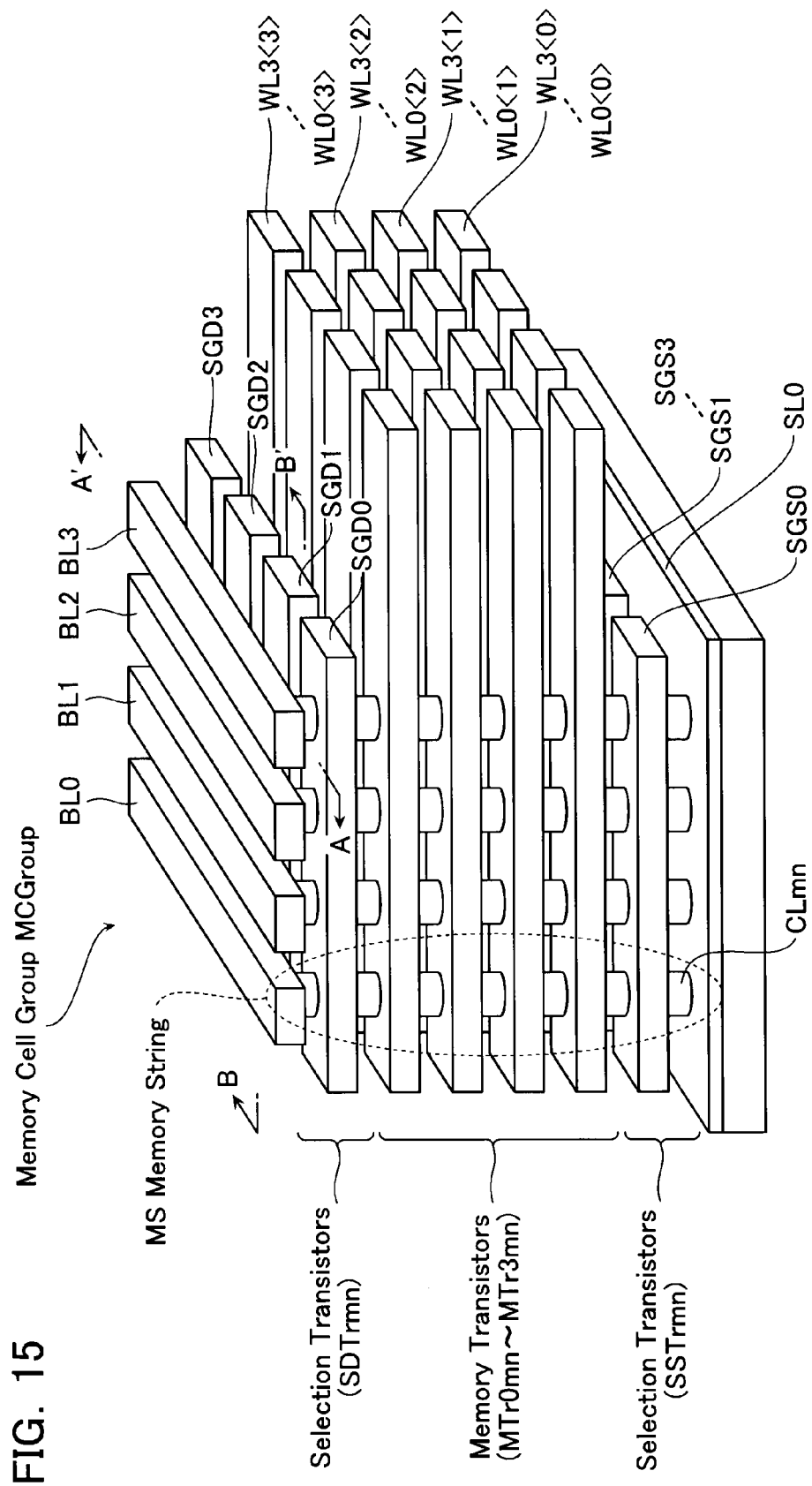
FIG. 15 is a perspective view illustrating a configuration of the memory transistor area 12 included in one memory cell group MCGroup in the non-volatile semiconductor storage device 100 according to the second embodiment of the present invention.
Figure 16:
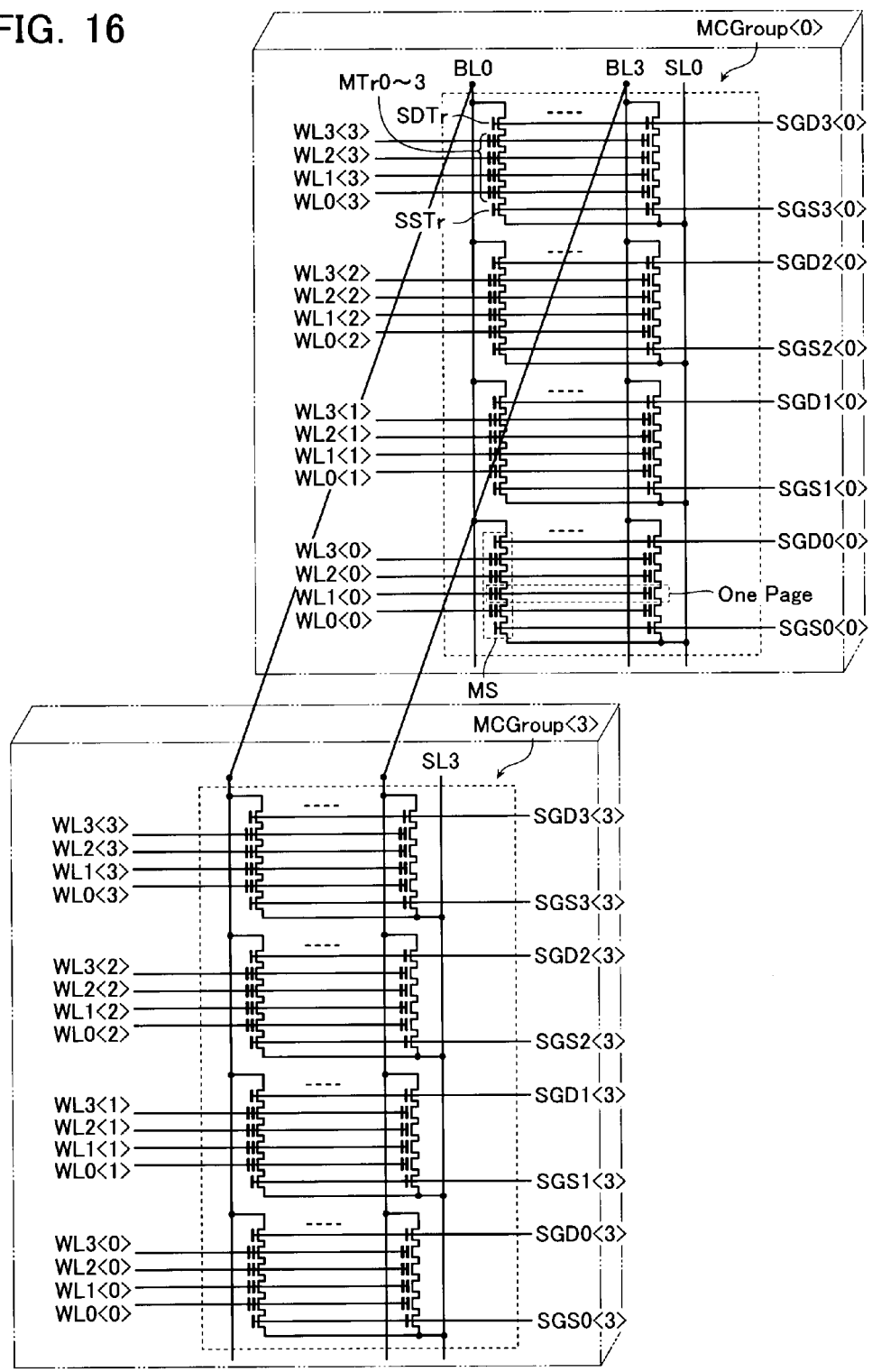
FIG. 16 is an equivalent circuit diagram illustrating a configuration of the memory transistor area 12 included in one memory cell group MCGroup in the non-volatile semiconductor storage device 100 according to the second embodiment of the present invention.

Referring now to FIGS. 15 and 16, a configuration of the memory transistor area 12 included in one memory cell group MCGroup will be described below. FIG. 15 is a schematic perspective view of the memory transistor area 12 included in one memory cell group MCGroup; and FIG. 16 is an equivalent circuit diagram of a plurality of memory cell groups MCGroup<0> to <3>.

FIG. 15 schematically illustrates a configuration of one memory cell group in the memory transistor area 12 in the non-volatile semiconductor storage device 100 according to the second embodiment of the present invention. In the second embodiment of the present invention, one memory cell group MCGroup in the memory transistor area 12 has M×N memory strings MS (where M and N are natural numbers), each including memory transistors (MTr0mn to MTr3mn) as well as selection transistors SSTrmn and SDTrmn. In FIG. 15, for example, consider that M=4, N=4 (m=0 to 3, n=0 to 3), and the number of laminated word lines WL p=4, then a total of 64 memory transistors MTr are formed in one memory cell block, including 4×4=16 memory transistors in the planar direction and 4 memory transistors in the lamination direction. However, the present invention is not so limited.

The bit lines BL, the source-side selection gate lines SGS, and the drain-side selection gate lines SGD have the same configuration as that of the first embodiment (one memory cell block). However, this embodiment is different from the first embodiment in that the word lines WL (WL0<0> to WL3<3>) have a stripe pattern, with the row direction taken as their longitudinal direction, such that they are separated from each other by each column of memory strings in the column direction (4×4=16 word lines are provided along the cross-section in the lamination direction).

In addition, only one source line SL is provided in one memory cell group MCGroup. That is, a single source line SL0 is commonly connected to (shared by) sixteen memory strings MS that are arranged in a matrix form in the row and column directions in one memory cell group MCGroup.

Figure 17:
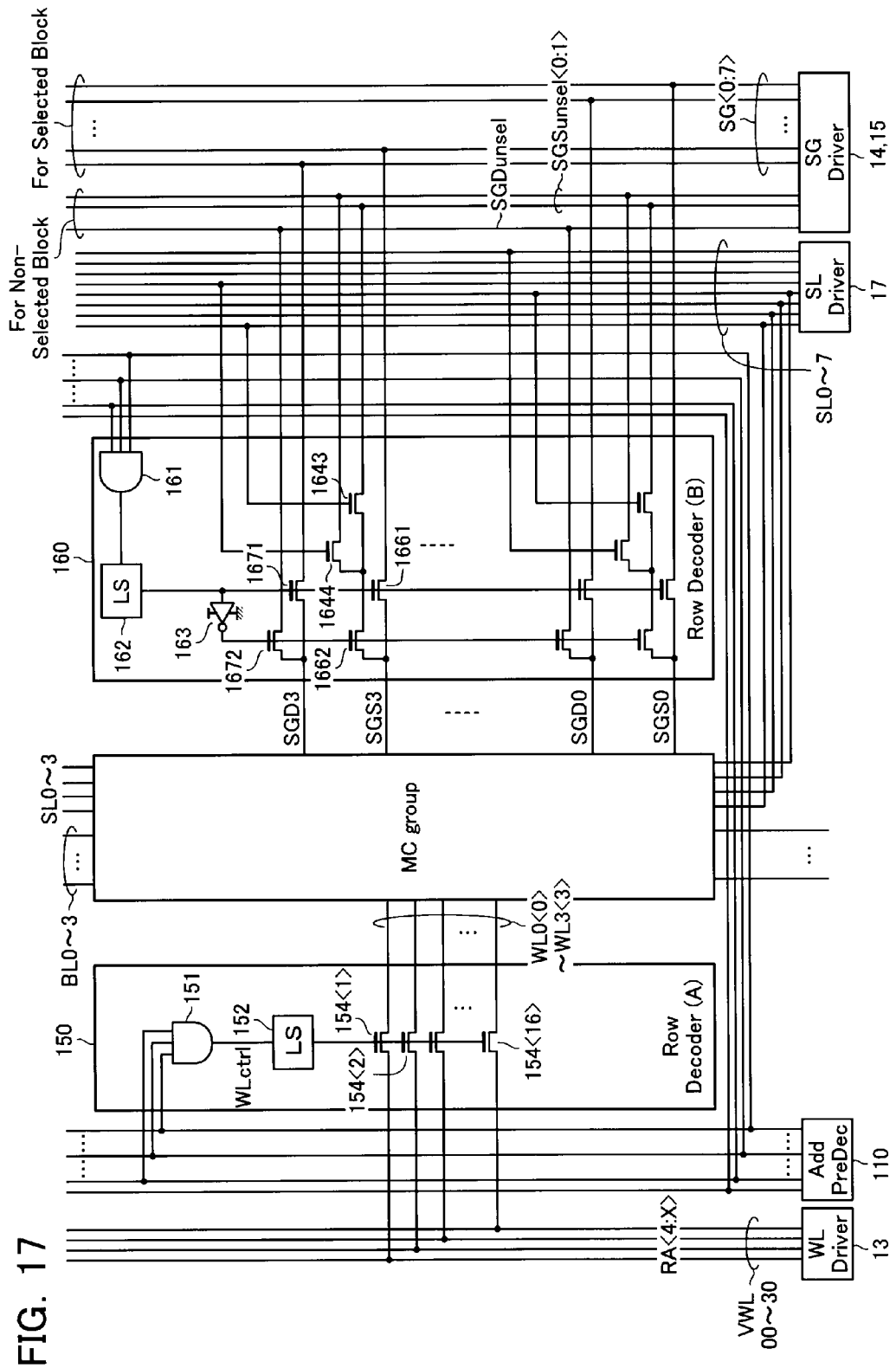
FIG. 17 illustrates a specific configuration of the row decoders 150 and 160 that are provided for one memory cell group MCGroup in the second embodiment.

FIG. 17 illustrates a specific configuration of row decoders 150 and 160 provided for one memory cell group MCGroup.

The row decoder 150 has the same configuration as that of the first embodiment, except in the number of transistors 154<1> to 154<16> provided as many as (sixteen) word lines WL.

The row decoder 160 comprises transistors 1661 to 1664 for each source-side selection gate line SGSm. These transistors also have substantially the same configuration as that of the transistors 1641 to 1644 of the first embodiment, and will not be explained again here.

Figure 18:
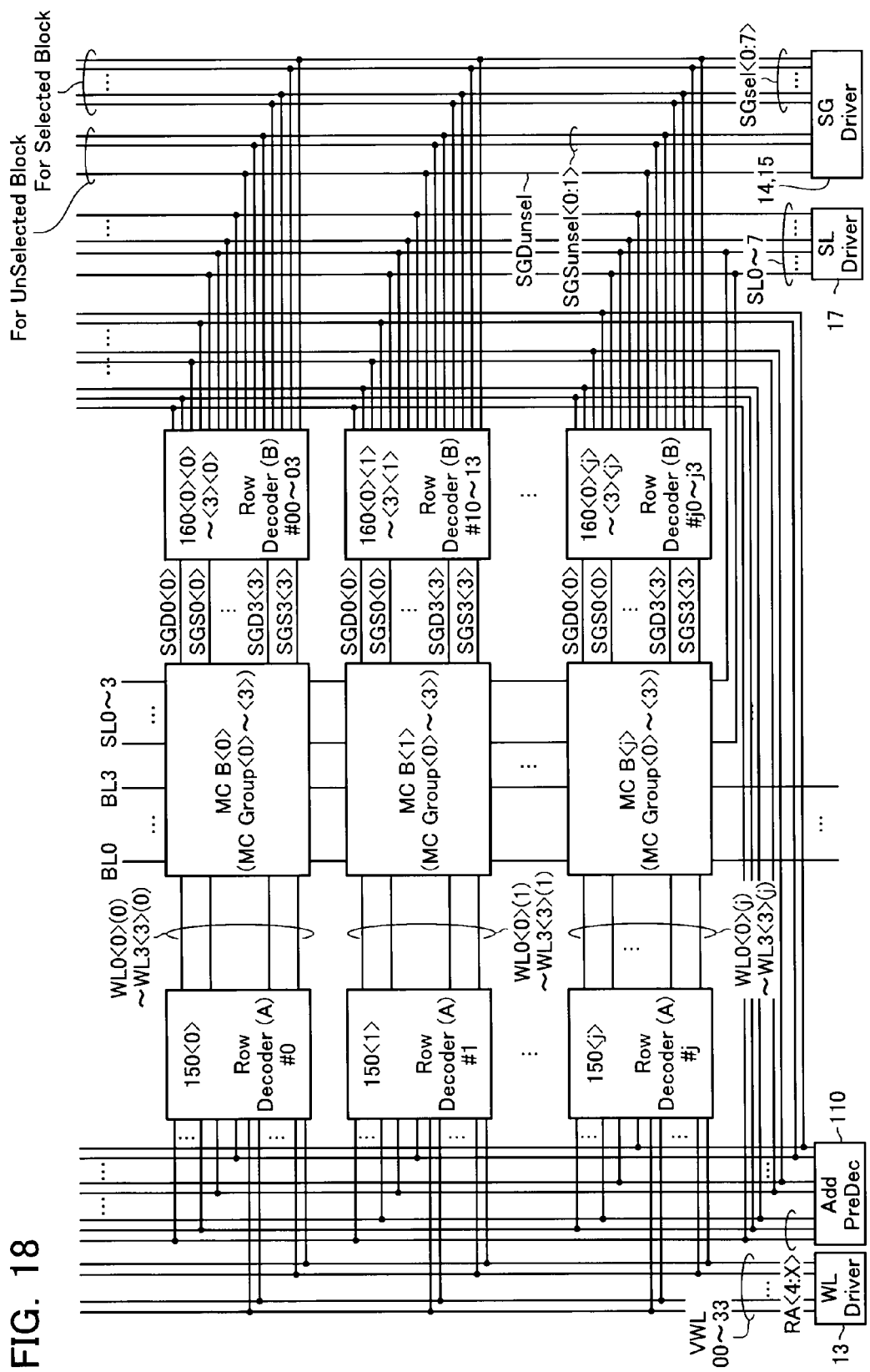
FIG. 18 illustrates exemplary allocation of row decoders 150 and 160 where a plurality of memory cell blocks <0> to <j> are present.

FIG. 18 illustrates an exemplary allocation of row decoders 150 and 160, where there are a plurality of memory cell blocks MCB<0> to MCB<j>. The bit lines BL0 to 3 and the source lines SL0 to 3 are commonly connected to the plurality of memory cell blocks MCB<0> to MCB<j>. Thus, for example, if the memory cell group MCgroup<0> in the memory cell block MCB<0> is selected to be erased, then an erase voltage is applied to the source line SL0, in which case the same erase voltage is also applied to the memory cell group MCGroup<0> in the unselected memory cell block MCB<1>. However, as described above, the selection gate lines SGS and SGD in each memory cell block MCB are configured to be able to be controlled independently of those in the other memory cell blocks MCB. As such, through the operation described below, data erase can be avoided at the memory cell group MCGroup<0> in the unselected memory cell block MCB<1>.

Figure 19:
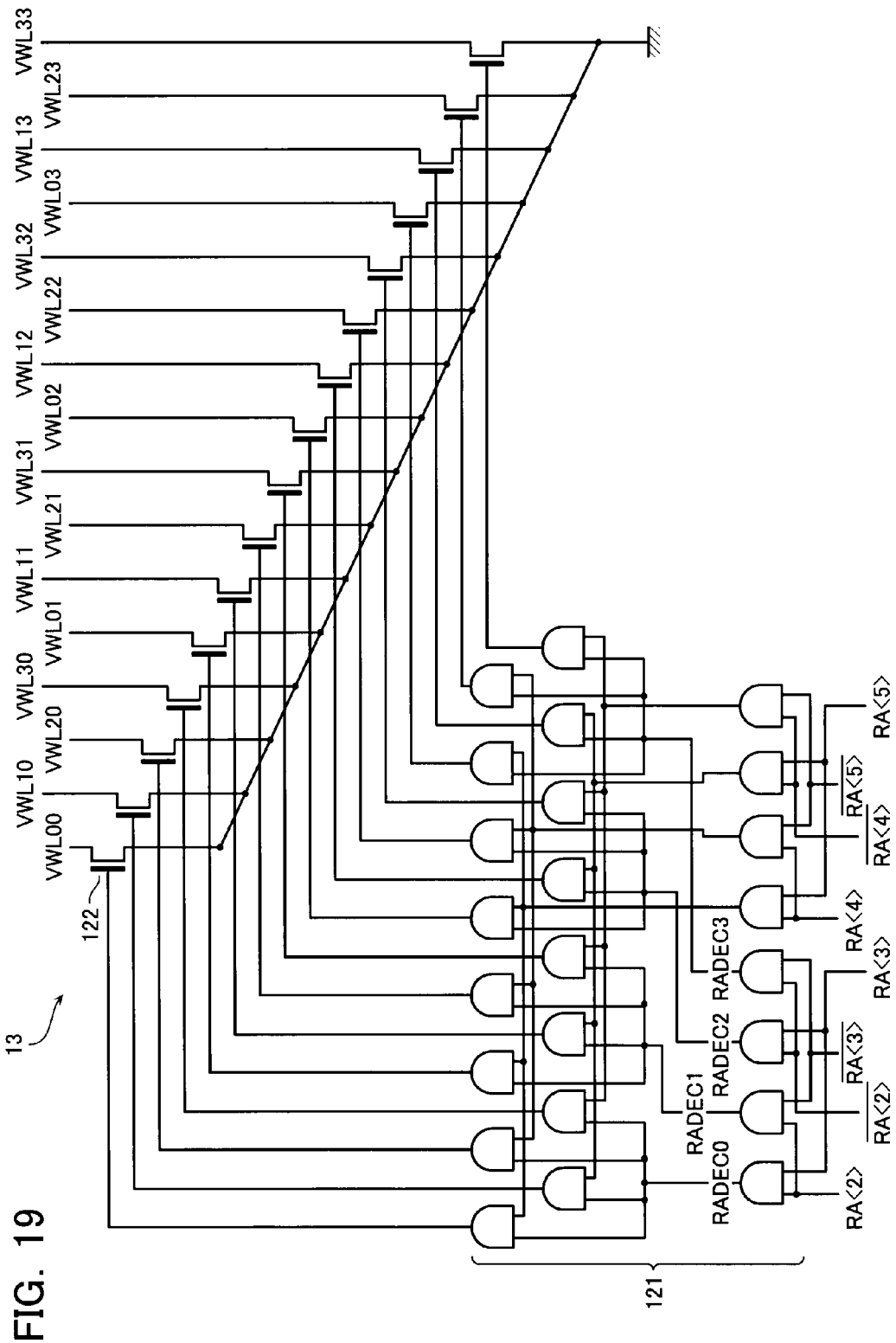
FIG. 19 illustrates a configuration of the word-line driving circuit 13 used in the non-volatile semiconductor storage device 100 according to the second embodiment.

FIG. 19 illustrates a configuration of the word-line driving circuit 13 used in this embodiment. Note that the source-side selection gate line driving circuit 14, the drain-side selection gate line driving circuit 15, and the source-line driving circuit 17 may have the same configuration as illustrated in FIGS. 10 and 11.

The word-line driving circuit 13 in FIG. 19 comprises a selection signal generation unit 121 and transistors 122, as described in conjunction with FIG. 9. The selection signal generation unit 121 is a combinational logic circuit including a combination of multiple AND gates. The selection signal generation unit 121 has a function for controlling one of sixteen transistors 122 to turn on and the others to turn off, according to 4-bit row address signals RA<2> to RA<5> and /RA<2> to /RA<5>. As a result, one of the drive signal lines VWL00 to 33 is only set at the ground voltage VSS, while the others are in a floating state.

[Erase Operation]

Figure 20:
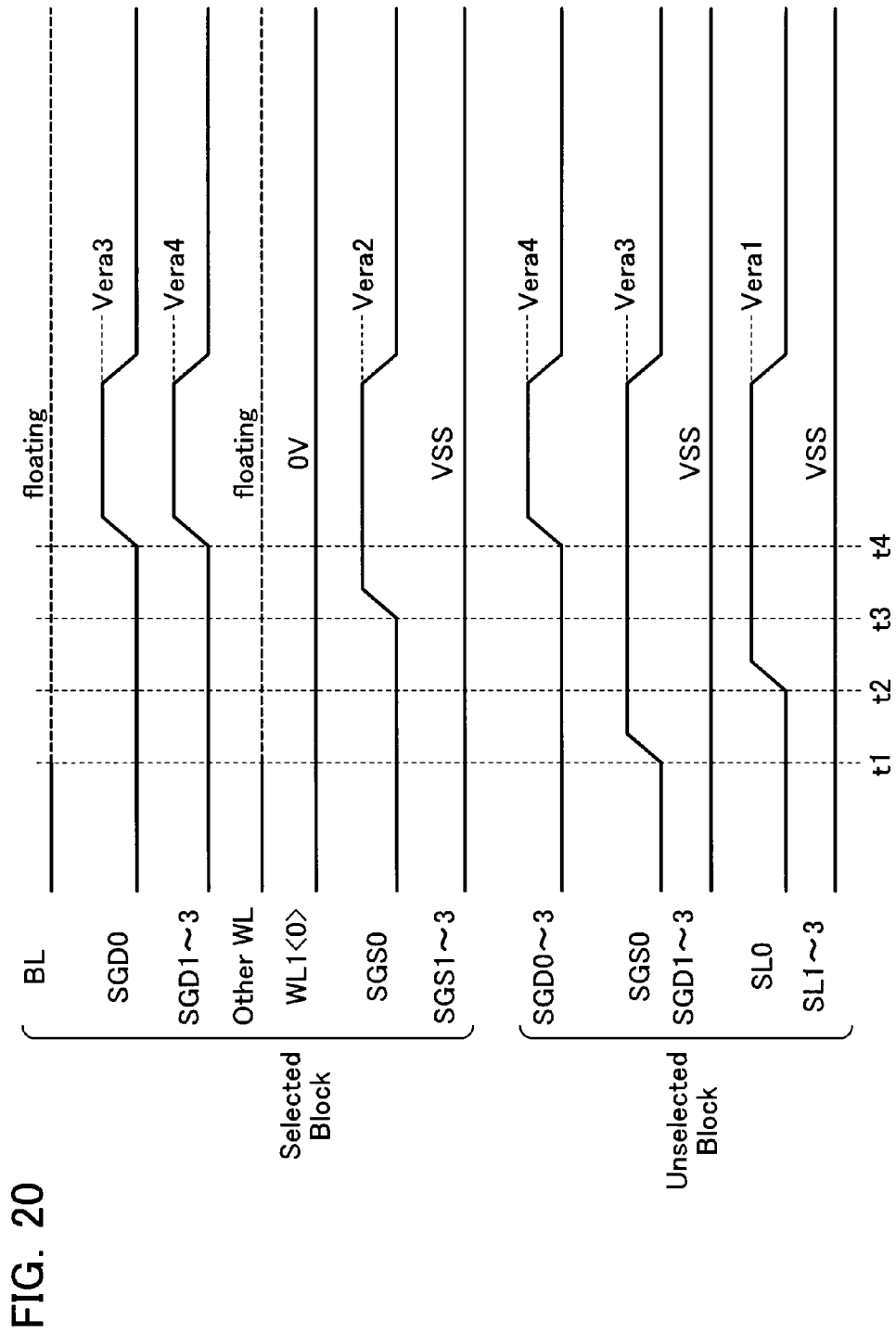
FIG. 20 is a timing chart illustrating an erase operation of the non-volatile semiconductor storage device 100 according to the second embodiment of the present invention.

Referring now to the timing chart of FIG. 20, an erase operation of the non-volatile semiconductor storage device 100 according to this embodiment will be described below. FIG. 20 illustrates the operations in the selected memory cell block (Selected Block) in which the memory cell to be erased is present, and in the other unselected memory cell blocks (Unselected Blocks).

At first, the description will be made focusing on the operation in the selected memory cell block. In this case, as illustrated in FIG. 16, consider that in a selected memory cell block, one page along a word line WL1<0> is selected as the target for a collective erase operation, from among those memory strings MS connected to the source line SL0 in the memory cell group MCGroup<0>.

Firstly, the word lines WL, the bit lines BL, the selection gate lines SGD, SGS, and the source line SL are all initialized to the ground voltage VSS. Then, at time t2, in the selected memory cell block, the erase voltage Vera1 is applied to the selected source line SL0, while the other source lines SL1 to 3 are maintained at the same ground voltage VSS as the initial states. That is, the memory cell group MCGroup<0> (one page in MCGroup<0>) is selected as the target for the data erase operation.

In addition, at time t3, delayed by a certain amount of time from time t2, only the source-side selection gate line SGS0 is boosted to the voltage Vera2. As a result, a GIDL current flows through those memory strings MS in the memory cell group MCGroup<0> that are connected to the source line SL0. This GIDL current charges the body parts of the memory strings MS, in which the page to be erased is present, to a voltage close to the voltage Vera2.

Thereafter, as in the first embodiment, at time t4, the voltages of the drain-side selection gate lines SGD0 to 3 are increased (SGD0 to the voltage Vera3, and SGD1 to 3 to the voltage Vera4) to prevent the occurrence of the GIDL current at the drain-side selection transistors SDTr.

On the other hand, the source-side selection gate lines SGS1 to 3 connected to the other memory strings MS are maintained at the ground voltage VSS. Accordingly, no GIDL current flows through these memory strings MS (the memory strings in which the page to be erased is not present), and hence data is not erased from the memory transistors in these memory strings MS.

Among the word lines WL0<0> to 3<3>, the word line WL1<0> corresponding to the page to be erased is maintained at the ground voltage VSS (0V), while the other fifteen word lines WL are previously set in a floating state. As a result, holes are injected into the electric charge accumulation films of the memory transistors MTr along the word line WL1<0>. This reduces the threshold voltages of the memory cell transistors MTr, and data is erased from these memory transistors. In contrast, the gate threshold voltages of the memory transistors MTr along the fifteen word lines WL that are made floating are increased due to coupling. Therefore, data is not erased from the memory transistors MTr along these word lines.

On the other hand, in the unselected memory cell blocks, the source-side selection gate line SGS0 is boosted to the voltage Vera3 at time t1 preceding time t2 when the voltage of the source line SL0 will be increased to the erase voltage Vera1. Thus, no GIDL current is produced in the unselected memory cell blocks. Since no GIDL current flows through the word lines WL that are commonly connected across a plurality of memory cell blocks, the erase operation is not performed in the unselected memory cell blocks.

Third Embodiment

Figure 21:
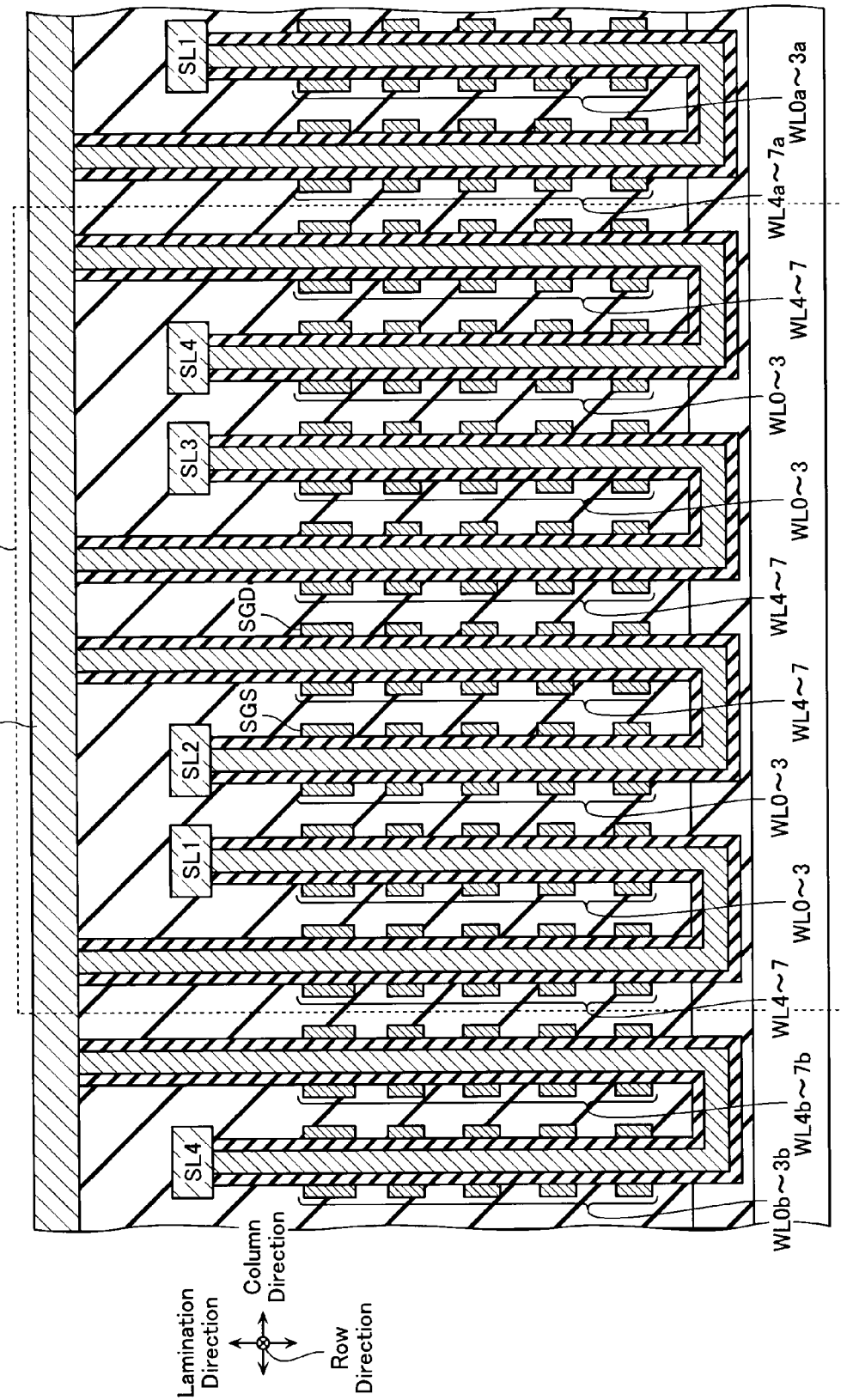
FIG. 21 is a schematic diagram illustrating a configuration of the non-volatile semiconductor storage device according to a third embodiment of the present invention.

Referring now to FIG. 21, the non-volatile semiconductor storage device 100 according to the third embodiment of the present invention will be described below. FIG. 21 is a cross-sectional view along the column direction of the memory device according to the third embodiment. In the above-mentioned embodiments, each memory string MS has a straight (I-shaped) columnar semiconductor CLmn, providing a body part. In contrast, the third embodiment is different from the above embodiments in that the body part (first semiconductor layer) of each memory string MS has a U-shaped semiconductor layer CLmnu that includes two columnar portions CLmn and a joining portion JPmn joining the columnar portions at their bottom ends.

The source lines SL have a stripe pattern such that they are separated from each other by a plurality of memory strings MS arranged in a row along the row direction, which is in common with the first embodiment. Word lines WL0 to 7 are different from the first embodiment in that they are provided to be separated from each other by each memory string MS because of structural constraints, and they does not provide plate-like electrodes commonly connected to the memory strings in one memory cell block MCB. In the non-volatile semiconductor storage device 100, memory strings MS that are aligned in the row direction (vertical to the sheet of FIG. 21) and connected to one source line SL are included in one memory cell block.

That is, the non-volatile semiconductor storage device illustrated in FIG. 21 is different from the non-volatile semiconductor storage device 100 only in that the I-shaped memory strings MS are merely folded at their midpoints and formed into U-shape. While the word lines WL are separated into a stripe pattern in the column direction because of structural constraints, data erase operations may be performed in the same way as described in the first embodiment by controlling the voltages of the separated word lines WL in a similar manner to that of the first embodiment.

Fourth Embodiment

Figure 22:
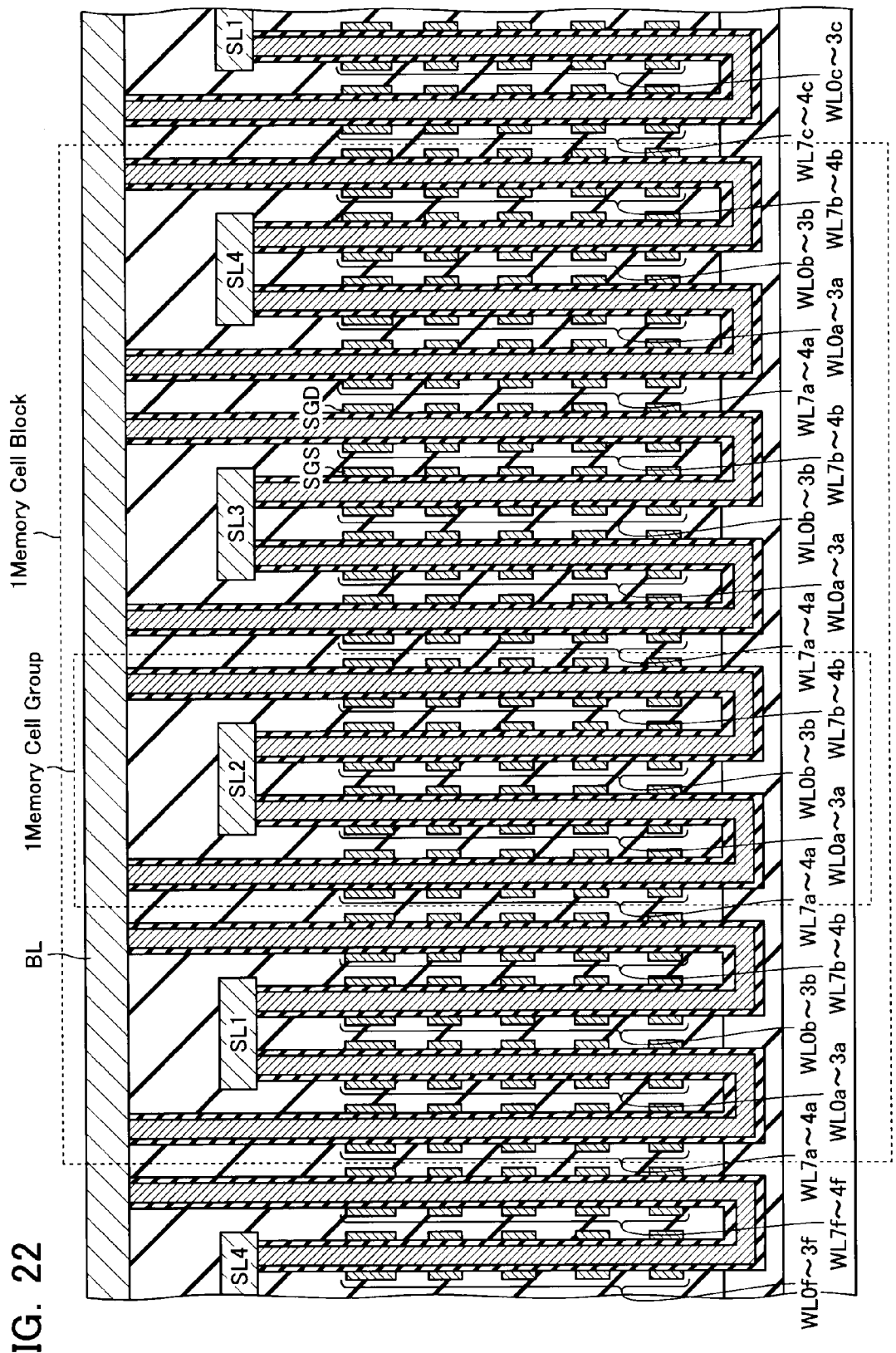
FIG. 22 is a schematic diagram illustrating a configuration of the non-volatile semiconductor storage device according to a fourth embodiment of the present invention.

Referring now to FIG. 22, the non-volatile semiconductor storage device 100 according to a fourth embodiment of the present invention will be described below. FIG. 22 is a cross-sectional view along the column direction of the memory device according to the fourth embodiment. This embodiment is similar to the third embodiment in that it has U-shaped semiconductor layers CLmnu.

In this embodiment, the source lines SL have a stripe pattern such that they are separated from each other at each point where they are shared by a plurality of memory strings MS arranged in two rows along the row direction. As such, in this embodiment, a plurality of memory strings MS arranged in two rows along the row direction are included in one memory cell group. If there are four memory strings in the vertical direction to the figure sheet, then 2×4 memory strings MS are included in one memory cell group. This memory cell group is a minimum unit of data erase operation (one page included in that memory cell group is selected to be erased). Since the memory cell group represents a unit of one data erase operation, the data erase operation according to this embodiment may be performed in substantially the same way as described in FIG. 20.

While embodiments of the present invention have been described, the present invention is not intended to be limited to the disclosed embodiments, and various other changes may be made thereto without departing from the spirit of the invention.

What is claimed is:

1. A non-volatile semiconductor storage device comprising:
    a memory string including a plurality of memory transistors connected in series;
    a drain-side selection transistor formed at one end of the memory string and operative to be conductive when selecting the memory string;
    a source-side selection transistor formed at the other end of the memory string and operative to be conductive when selecting the memory string;
    a bit line connected to the other end of the drain-side selection transistor, the bit line operative to be provided with a voltage corresponding to data to be written to a respective one of the memory transistors and to read a signal read from a respective one of the memory transistors;
    a source line connected to the other end of the source-side selection transistor; and
    a control circuit configured to control the memory transistors, the drain-side selection transistor, and the source-side selection transistor to perform read, write, and erase operations on the memory transistors,
    the memory string comprising:
        a first semiconductor layer having a columnar portion extending in a vertical direction to a substrate and functioning as a body of a respective one of the plurality of memory transistors;
        an electric charge accumulation layer formed to surround the first semiconductor layer; and
        a first conductive layer formed to surround the electric charge accumulation layer and extend in parallel to the substrate, the first conductive layer being laminated to form a plurality of layers and functioning as gates of the plurality of memory transistors,
    the drain-side selection transistor comprising:
        a second semiconductor layer in contact with one end of the first semiconductor layer and extending in the vertical direction to the substrate, the second semiconductor layer functioning as a body of the drain-side selection transistor;
        a second gate insulation layer formed to surround the second semiconductor layer; and
        a second conductive layer surrounding the second gate insulation layer and extending in parallel to the substrate, the second conductive layer functioning as a gate of the drain-side selection transistor,
    the source-side selection transistor comprising:
        a third semiconductor layer in contact with the other end of the first semiconductor layer and extending in the vertical direction to the substrate, the third semiconductor layer functioning as a body of the source-side selection transistor;
        a third gate insulation layer formed to surround the third semiconductor layer; and
        a third conductive layer surrounding the third gate insulation layer and extending in parallel to the substrate, the third conductive layer functioning as a gate of the source-side selection transistor,
    m rows and n columns of the first semiconductor layers arranged on the substrate being included in one memory cell block (where m and n are integers not less than 2),
    each of the first conductive layers being commonly connected to the (m×n) first semiconductor layers arranged in the one memory cell block,
    each of the second conductive layers being commonly connected to the n second semiconductor layers arranged along a first direction in the one memory cell block,
    each of the third conductive layers being commonly connected to the n third semiconductor layers arranged along the first direction in the one memory cell block,
    each of the bit lines being commonly connected to the m second semiconductor layers arranged along a second direction orthogonal to the first direction in the one memory cell block,
    each of the source lines being commonly connected to the n third semiconductor layers arranged along the first direction in the one memory cell block,
    when performing a data erase operation in the one memory cell block, the control circuit being configured to:
        apply a first voltage to one source line selected from the m source lines in the one memory cell block, while applying a second voltage to the other source lines, the second voltage being equal to a voltage of the source lines before the data erase operation begins;
        then, after a certain time delay from application of the first voltage, apply a third voltage smaller than the first voltage to the third conductive layer of the source-side selection transistor connected to the selected source line, thereby producing a hole current near the third gate insulation layer due to a potential difference between the first voltage and the third voltage; and
        apply a fourth voltage to one of the first conductive layers that is connected to the memory transistor to be erased, while bringing the other first conductive layers into a floating state, thereby causing a change in electric charge of the electric charge accumulation layers due to a potential difference between potentials of the first semiconductor layers and the first conductive layers.

2. The non-volatile semiconductor storage device according to claim 1, wherein
    the first conductive layers other than the first conductive layer connected to the memory transistor to be erased are brought into a floating state prior to application of the first voltage to the selected source line.

3. The non-volatile semiconductor storage device according to claim 1, wherein
    the source lines are at a ground voltage before the data erase operation begins.

4. The non-volatile semiconductor storage device according to claim 1, wherein
    the control circuit is configured to apply, at a timing prior to application of the first voltage, the third voltage to the third conductive layer of the source-side selection transistor connected to the selected source line in each memory cell block not to be erased.

5. The non-volatile semiconductor storage device according to claim 4, wherein
    the first conductive layers other than the first conductive layer connected to the memory transistor to be erased are brought into a floating state prior to application of the first voltage to the selected source line.

6. The non-volatile semiconductor storage device according to claim 4, wherein the source lines are at a ground voltage before the data erase operation begins.

7. The non-volatile semiconductor storage device according to claim 1, wherein
when performing a data erase operation, a third voltage is applied to the second conductive layer to prevent the occurrence of a hole current near the second gate insulation layer due to a potential difference between potentials of the second semiconductor layer and the second conductive layer, while the bit line is maintained in a floating state.

8. The non-volatile semiconductor storage device according to claim 7, wherein
the control circuit is configured to apply the third voltage to the second conductive layer at a timing delayed by a certain amount of time from application of the third voltage to the third conductive layer.

9. The non-volatile semiconductor storage device according to claim 1, wherein
the m source lines are shared by a plurality of the memory cell blocks.

10. The non-volatile semiconductor storage device according to claim 1, wherein
the m source lines are shared by a plurality of the memory cell blocks, and
prior to application of the first voltage to the selected source line, a fifth voltage smaller than the first voltage is applied to the third conductive layers that are disposed in the memory cell blocks other than the memory cell block selected as a target for the data erase operation.

11. A non-volatile semiconductor storage device comprising:
a memory string including a plurality of memory transistors connected in series;
a drain-side selection transistor formed at one end of the memory string and operative to be conductive when selecting the memory string;
a source-side selection transistor formed at the other end of the memory string and operative to be conductive when selecting the memory string;
a bit line connected to the other end of the drain-side selection transistor, the bit line operative to be provided with a voltage corresponding to data to be written to a respective one of the memory transistors and to read a signal read from a respective one of the memory transistors;
a source line connected to the other end of the source-side selection transistor; and
a control circuit configured to control the memory transistors, the drain-side selection transistor, and the source-side selection transistor to perform read, write, and erase operations on the memory transistors,
the memory string comprising:
a first semiconductor layer having a columnar portion extending in a vertical direction to a substrate and functioning as a body of a respective one of the plurality of memory transistors;
an electric charge accumulation layer formed to surround the first semiconductor layer; and
a first conductive layer formed to surround the electric charge accumulation layer and extend in parallel to the substrate, the first conductive layer being laminated to form a plurality of layers and functioning as gates of the plurality of memory transistors,
the drain-side selection transistor comprising:
a second semiconductor layer in contact with one end of the first semiconductor layer and extending in the vertical direction to the substrate, the second semiconductor layer functioning as a body of the drain-side selection transistor;
a second gate insulation layer formed to surround the second semiconductor layer; and
a second conductive layer surrounding the second gate insulation layer and extending in parallel to the substrate, the second conductive layer functioning as a gate of the drain-side selection transistor,
the source-side selection transistor comprising:
a third semiconductor layer in contact with the other end of the first semiconductor layer and extending in the vertical direction to the substrate, the third semiconductor layer functioning as a body of the source-side selection transistor;
a third gate insulation layer formed to surround the third semiconductor layer; and
a third conductive layer surrounding the third gate insulation layer and extending in parallel to the substrate, the third conductive layer functioning as a gate of the source-side selection transistor,
m rows and n columns of the (m×n) first semiconductor layers arranged on the substrate being included in one memory cell group (where m and n are integers not less than 2),
each of the first conductive layers being commonly connected to the n first semiconductor layers aligned along a first direction in the one memory cell group,
each of the second conductive layers being commonly connected to the n second semiconductor layers arranged along the first direction in the one memory cell group,
each of the third conductive layers being commonly connected to the n third semiconductor layers arranged along the first direction in the one memory cell group,
each of the bit lines being commonly connected to the m second semiconductor layers arranged along a second direction orthogonal to the first direction in the one memory cell group,
each of the source lines being commonly connected to the (m×n) third semiconductor layers in the one memory cell group,
when performing a data erase operation in the one memory cell group, the control circuit being configured to:
apply a first voltage to one of the source lines that is disposed in the memory cell group in which the memory transistor to be erased is present;
then, after a certain time delay from application of the first voltage, apply a second voltage smaller than the first voltage to one of the m third conductive layers in the one memory cell group that is connected to the source-side selection transistor corresponding to the memory transistor to be erased, thereby producing a hole current near the third gate insulation layer due to a potential difference between the first voltage and the second voltage, while applying a third voltage to the other third conductive layers, the third voltage being equal to a voltage of the third conductive layers before the data erase operation begins; and
apply a fourth voltage to one of the first conductive layers that is connected to the memory transistor to be erased, while bringing the other first conductive layers into a floating state, thereby causing a change in electric charge of the electric charge accumulation layers due to a potential difference between potentials of the first semiconductor layers and the first conductive layers.

12. The non-volatile semiconductor storage device according to claim 11, wherein
the first conductive layers other than the first conductive layer connected to the memory transistor to be erased are brought into a floating state prior to application of the first voltage to the selected source line.

13. The non-volatile semiconductor storage device according to claim 11, wherein
the source lines are at a ground voltage before the data erase operation begins.

14. The non-volatile semiconductor storage device according to claim 11, wherein
the control circuit is configured to apply, at a timing prior to application of the first voltage, the third voltage to the third conductive layer of the source-side selection transistor in each memory cell block not to be erased.

15. The non-volatile semiconductor storage device according to claim 14, wherein
the first conductive layers other than the first conductive layer connected to the memory transistor to be erased are brought into a floating state prior to application of the first voltage to the selected source line.

16. The non-volatile semiconductor storage device according to claim 14, wherein
the source lines are at a ground voltage before the data erase operation begins.

17. The non-volatile semiconductor storage device according to claim 11, wherein
when performing a data erase operation, a third voltage is applied to the second conductive layer to prevent the occurrence of a hole current near the second gate insulation layer due to a potential difference between potentials of the second semiconductor layer and the second conductive layer, while the bit line is maintained in a floating state.

18. The non-volatile semiconductor storage device according to claim 17, wherein
the control circuit is configured to apply the third voltage to the second conductive layer at a timing delayed by a certain amount of time from application of the third voltage to the third conductive layer.

19. The non-volatile semiconductor storage device according to claim 11, wherein
a plurality of the memory cell groups share the n first conductive layers and comprise the independent second and third conductive layers, respectively.

20. The non-volatile semiconductor storage device according to claim 19, wherein
the plurality of the memory cell groups have independent source lines, respectively, and the control circuit is configured to apply the first voltage to any one of the plurality of source lines.

* * * * *